(12) United States Patent
Masuda et al.

(10) Patent No.: US 8,247,888 B2
(45) Date of Patent: Aug. 21, 2012

(54) SEMICONDUCTOR DEVICE AND METHOD FOR MANUFACTURING METALLIC SHIELDING PLATE

(75) Inventors: Masachika Masuda, Tokorozawa (JP); Kazunori Oda, Kawaguchi (JP); Koji Tomita, Kawagoe (JP); Kazuyuki Miyano, Sayama (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 199 days.

(21) Appl. No.: 12/702,660

(22) Filed: Feb. 9, 2010

(65) Prior Publication Data

US 2010/0270660 A1 Oct. 28, 2010

(30) Foreign Application Priority Data

Apr. 28, 2009 (JP) ................................. 2009-109369
Jun. 5, 2009 (JP) ................................. 2009-136462

(51) Int. Cl.
*H01L 23/58* (2006.01)
*H01F 41/14* (2006.01)

(52) U.S. Cl. .................. 257/659; 257/E23.002; 438/64; 438/121

(58) Field of Classification Search .................. 257/659, 257/E23.002; 438/64, 121
See application file for complete search history.

(56) References Cited

U.S. PATENT DOCUMENTS 5,294,826 A * 3/1994 Marcantonio et al. ........ 257/659
5,872,331 A * 2/1999 Ando et al. .................... 174/381
6,399,879 B1 * 6/2002 Ueda et al. .................... 174/389
7,781,266 B2 * 8/2010 Zhao et al. .................... 438/123
2003/0209783 A1 * 11/2003 Casati et al. .................. 257/659
2005/0116145 A1 * 6/2005 Aki et al. .................... 250/214.1
2005/0226030 A1   10/2005 Kato et al.
2009/0230487 A1 * 9/2009 Saitoh et al. ................. 257/419
2010/0157566 A1 * 6/2010 Bogursky et al. ............. 361/816

FOREIGN PATENT DOCUMENTS

| JP | 09-130082 | | 5/1997 |
| JP | 1998-93284 | | 4/1998 |
| JP | 2009141194 A | * | 6/2009 |
| KR | 10-0482924 | | 7/1998 |
| KR | 10-2005-0084773 | | 8/2005 |

* cited by examiner

*Primary Examiner* — Fernando L. Toledo
*Assistant Examiner* — John P Dulka
(74) *Attorney, Agent, or Firm* — Burr & Brown

(57) ABSTRACT

Provided is a semiconductor device capable of preventing a semiconductor chip from being damaged by any sharp burrs of a metallic shielding plate. The semiconductor device includes a semiconductor chip and a metallic shielding plate provided on a circuit surface of the semiconductor chip. The metallic shielding plate is disposed in such a manner that a second surface of a shielding plate body is directed towards the circuit surface of the semiconductor chip, and burrs are positioned contiguous to the second surface of the shielding plate body. At distal ends of the burrs, cutting burrs are formed in a direction orthogonal to the second surface. The sharp burrs extend in a direction opposite to the semiconductor chip, so that the sharp burrs are prevented from damaging the circuit surface of the semiconductor chip.

13 Claims, 25 Drawing Sheets

US 8,247,888 B2

SEMICONDUCTOR DEVICE AND METHOD FOR MANUFACTURING METALLIC SHIELDING PLATE

CROSS-REFERENCE TO RELATED APPLICATIONS

The present patent application benefits from Japanese Patent Application No. 2009-109369 filed on Apr. 28, 2009, and Japanese Patent Application No. 2009-136462 filed on Jun. 5, 2009, the entire content of which is hereby incorporated by reference into the present application.

BACKGROUND OF THE INVENTION

1. Field of the Invention

The present invention relates generally to semiconductor devices having a metallic shielding plate to protect a semiconductor chip from magnetism. More particularly, the invention is directed to a semiconductor device capable of preventing a semiconductor chip from becoming damaged by contact with any burrs formed at edges of a metallic shielding plate during cutting thereof. The invention also concerns a method of manufacturing a metallic shielding plate used in a semiconductor device including a semiconductor chip and a resin for sealing the semiconductor chip, the metallic shielding plate protecting the semiconductor chip from external magnetism.

2. Description of the Related Art

Semiconductor devices with a semiconductor chip such as a magnetoresistive random-access memory (MRAM) contain a metallic shielding plate in the device. In order to protect the semiconductor chip of a semiconductor device from the magnetism (magnetic fields) entering from the outside of the semiconductor device, such a metallic shielding plate is fabricated from a metallic material having a magnetic shielding effect.

A metallic shielding plate would be fabricated by machining a metallic material using a press. The metallic shielding plate thus completed, however, will have machining burrs or rough edges and suffer deformation, and in such a case, the burrs have tended to damage the circuits of the semiconductor chip due to contact with the circuit surface of the chip. Accordingly, the fabrication of a metallic shielding plate by press machining has been problematic.

For this reason, it has been common to fabricate metallic shielding plates using an etching method. Among conceivable etching methods is single-side etching, in which method, individual metallic shielding plates will be fabricated by first providing a metallic material that includes a taping material attached to one surface, and then etching the metallic material from the surface side opposite to the particular surface. The single-side etching method, however, has the problem that it requires an etching time nearly twice as much as a metallic shielding plate is fabricated by etching both sides of a metallic material at the same time. Single-side etching method has another problem in that since the etched section will have a shape tapered off to one side, the shielding effect at the edges of the metallic shielding plate will decrease.

Patent Document 1: JP-A-9-130082

SUMMARY OF THE INVENTION

In contrast to the above, it has been attempted to first fabricate a metallic shielding sheet including a plurality of metallic shielding plates, and then separate the metallic shielding sheet into the metallic shielding plates by blade-cutting the connections that interconnect the metallic shielding plates. During the manufacture of semiconductor devices, however, sharp burrs occur at the connections of each metallic shielding plate and if the sharp burrs come into contact with a semiconductor chip or a substrate, this could damage the semiconductor chip or the substrate.

The present invention has been made considering such damage, and an object of the invention is to provide a semiconductor device capable of preventing a semiconductor chip from being damaged by contact with any sharp burrs of a metallic shielding plate.

A first aspect of the present invention is a semiconductor device comprising: a semiconductor chip with a circuit surface; and a metallic shielding plate provided at least on the circuit surface of the semiconductor chip, wherein: the metallic shielding plate has a shielding plate body including a first surface and a second surface, and burrs protruding sideward from the shielding plate body, the metallic shielding plate is disposed in such a manner that the second surface of the shielding plate body is directed towards the circuit surface of the semiconductor chip; the burrs are positioned contiguous to the second surface of the shielding plate body; and at distal ends of the burrs, sharp burrs are formed in a direction orthogonal to the second surface, the sharp burrs extending in a direction opposite to the semiconductor chip.

The metallic shielding plate of the semiconductor device in the first aspect of the present invention is formed from a material containing an Fe—Ni alloy.

A second aspect of the present invention is a semiconductor device comprising: a semiconductor chip with a circuit surface; and a metallic shielding plate provided at least on the circuit surface of the semiconductor chip, wherein: the metallic shielding plate has a shielding plate body including a first surface and a second surface, and burrs protruding sideward from the shielding plate body, the metallic shielding plate is disposed in such a manner that the first surface of the shielding plate body is directed towards the circuit surface of the semiconductor chip; the burrs are positioned contiguous to the second surface of the shielding plate body; and at distal ends of the burrs, sharp burrs are formed in a direction orthogonal to the second surface.

The metallic shielding plate of the semiconductor device in the second aspect of the present invention is formed from a material containing an Fe—Ni alloy.

A third aspect of the present invention is a semiconductor device comprising: a substrate; a first metallic shielding plate provided on the substrate; a semiconductor chip provided on the first metallic shielding plate and having a circuit surface thereon; and a second metallic shielding plate provided on the circuit surface of the semiconductor chip, wherein: the first metallic shielding plate has a shielding plate body including a first surface and a second surface, and burrs protruding sideward from the shielding plate body, the first metallic shielding plate is disposed in such a manner that the second surface of the shielding plate body is directed towards the substrate; the burrs are positioned contiguous to the second surface of the shielding plate body; and at distal ends of the burrs, sharp burrs are formed in a direction orthogonal to the second surface, the sharp burrs extending in a direction opposite to the substrate.

The first metallic shielding plate and second metallic shielding plate of the semiconductor device in the third aspect of the present invention are each formed from a material containing an Fe—Ni alloy.

A fourth aspect of the present invention is a semiconductor device comprising: a substrate; a first metallic shielding plate provided on the substrate; a semiconductor chip provided on the first metallic shielding plate and having a circuit surface thereon; and a second metallic shielding plate provided on the circuit surface of the semiconductor chip, wherein: the first metallic shielding plate has a shielding plate body including a first surface and a second surface, and burrs protruding sideward from the shielding plate body, the first metallic shielding plate is disposed in such a manner that the first surface of the shielding plate body is directed towards the substrate; the burrs are positioned contiguous to the second surface of the shielding plate body; and at distal ends of the burrs, sharp burrs are formed in a direction orthogonal to the second surface.

A fifth aspect of the present invention is a method of manufacturing a metallic shielding plate used in a semiconductor device inclusive of a semiconductor chip and of a resin for sealing the semiconductor chip, wherein the metallic shielding plate protects the semiconductor chip from external magnetism, the method comprising the steps of: providing permalloy PC materials; working each of the permalloy PC materials to form flat-plate-like, worked permalloy PC materials each including at least one metallic shielding plate; arranging the plurality of flat-plate-like, worked permalloy PC materials in a mutually stacked manner and placing the stacked materials in a heat-treating furnace; subjecting the worked permalloy PC materials to heat treatment at 650° C. to 850° C. under an inert gas atmosphere in the heat-treating furnace; and separating the metallic shielding plate from each of the worked permalloy PC materials.

In the method of the fifth aspect of the present invention, the plurality of worked permalloy PC materials are each stacked via a spacer, and the spacer has the same coefficient of linear expansion as the permalloy PC material.

In the method of the fifth aspect of the present invention, the spacer is formed from a permalloy PC material.

In the method of the fifth aspect of the present invention, the step of heat-treating the worked permalloy PC materials includes a substep inclusive of an annealing substep of cooling each worked permalloy PC material gradually after the worked permalloy PC material is heated at 650° C. to 850° C.

In the method of the fifth aspect of the present invention, each of the worked permalloy PC materials includes a plurality of metallic shielding plates.

As outlined above, according to the present invention, since sharp burrs of a metallic shielding plate, formed at distal ends of other burrs in a manufacturing process for a semiconductor device, are kept out of contact with a semiconductor chip and a substrate, this characteristic prevents the semiconductor chip from being damaged by contact with the sharp burrs of the metallic shielding plate.

In addition, according to the present invention, worked permalloy PC materials are subjected to heat treatment at 650° C. to 850° C. under an inert gas atmosphere in a heat-treating furnace, so when the heat treatment is conducted, it is unnecessary to interpose alumina powder between the worked permalloy PC materials. This allows efficient fabrication of a metallic shielding plate for semiconductor devices while ensuring the characteristics (high magnetic permeability and low coercivity) required of the metallic shielding plate. Furthermore, since the worked permalloy PC materials are kept free from softening and deformation in the heat-treating furnace, metallic shielding plates can be obtained at a high conforming-product rate.

DETAILED DESCRIPTION OF THE INVENTION (First Embodiment)

Hereunder, a first embodiment of the present invention will be described with reference made to the accompanying drawings. FIGS. 1 to 23 illustrate the first embodiment of the present invention.

(Configuration of a Metallic Shielding Sheet)

First, a metallic shielding sheet is outlined below in accordance with FIGS. 1 to 3(a) to 3(d).

Figure 1:
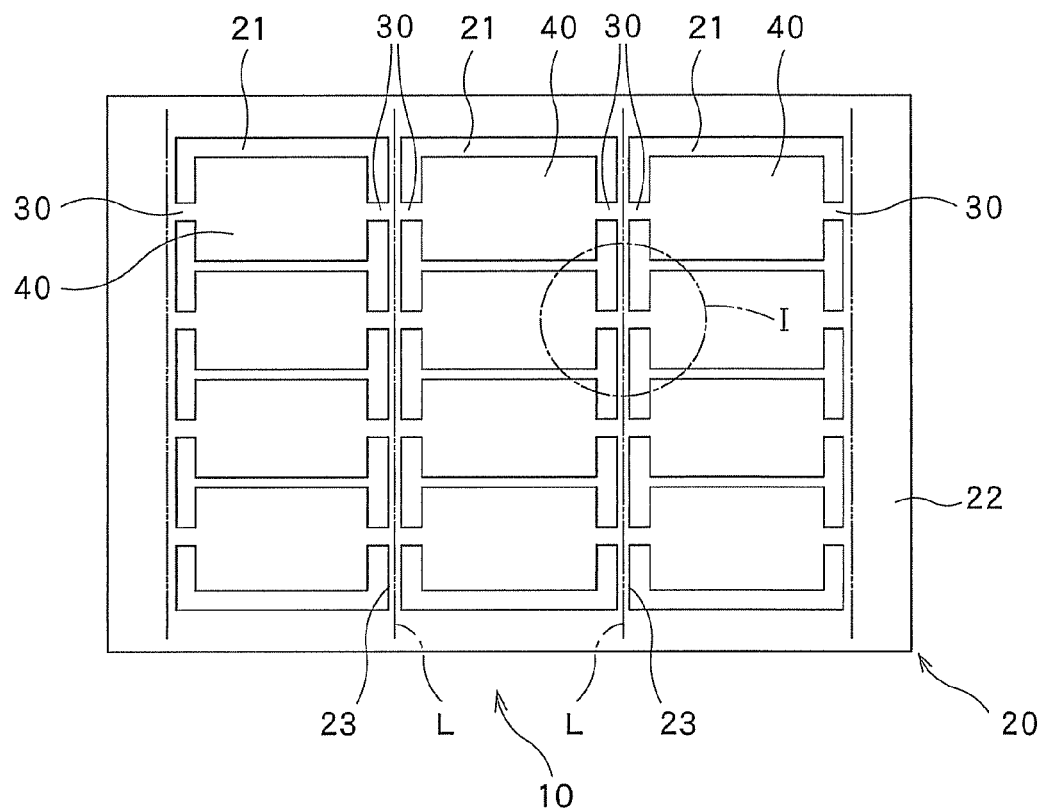
FIG. 1 is a plan view of a metallic shielding sheet.

As shown in FIG. 1, the metallic shielding sheet 10 includes a frame body 20 having a plurality of rectangular openings 21, and a plurality of metallic shielding plates 40 arranged in the openings 21 of the frame body 20 and connected to the frame body 20 via connecting portions 30. The frame body 20 includes an outer frame 22 that surrounds the plurality of entire openings 21, and a plurality of elongated stays 23 formed between mutually adjacent openings 21 and arranged in parallel to one another. The outer frame 22 and stays 23 of the frame body 20, and the metallic shielding plates 40 are the same in thickness between one another.

As shown in FIG. 1, the connecting portions (hereinafter, referred to as the connections) 30 are provided on lateral edges of each metallic shielding plate 40. That is to say, each connection 30 interconnects the corresponding lateral edge of the metallic shielding plate 40 and the corresponding stay 23 (or outer frame 22) of the frame body 20.

Figure 2:
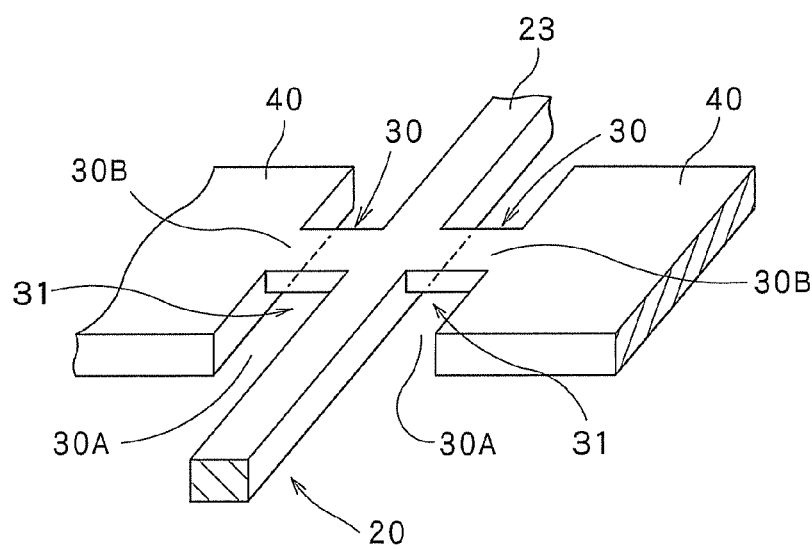
FIG. 2 is an enlarged, perspective view of section I of FIG. 1.
Figure 3:
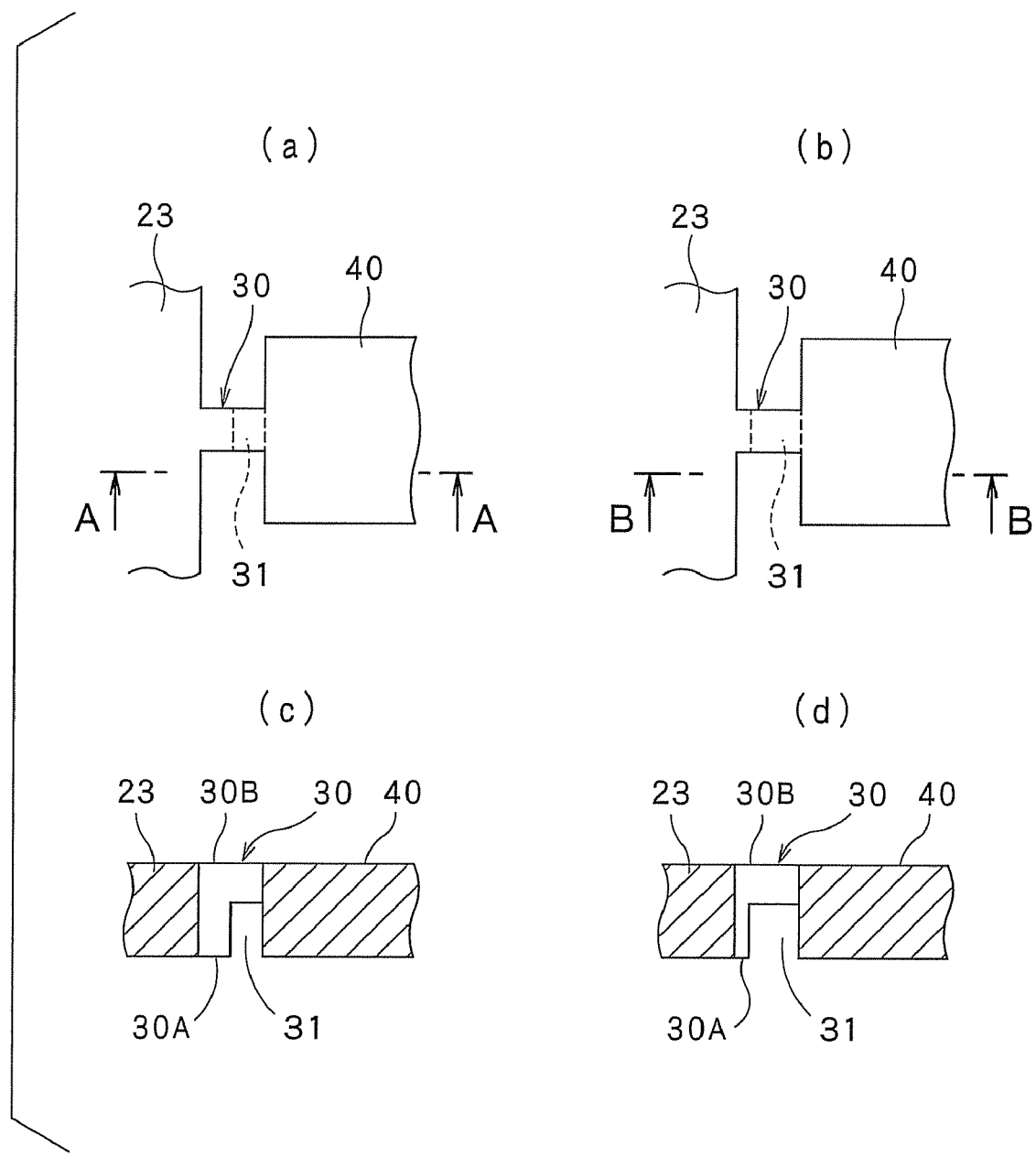
FIGS. 3(a) and 3(b) illustrate different variations of a connecting portion on the metallic shielding sheet.
FIG. 3(c) is a sectional view taken along line A-A of FIG. 3(a)
FIG. 3(d) is a sectional view taken along line B-B of FIG. 3(b)

In addition, as shown in FIG. 2, the connection 30 is formed over its entire region more thinly than the metallic shielding plate 40, having an etching space 31 formed to extend from a first surface 30A (lower surface in FIG. 2) of the connection 30, towards a second surface 30B (upper surface in FIG. 2) thereof.

The metallic shielding sheet 10 is fabricated by etching one metallic plate (metallic substrate 70) as will be described later herein. That is to say, the frame body 20, connection 30, and metallic shielding plate 40 of the metallic shielding sheet 10 are formed integrally with one another. The metallic shielding sheet 10 may preferably be formed from a material of high magnetic permeability, such as a permalloy PC material or any other material that contains an Fe—Ni alloy.

The thickness of the connection 30 may preferably be about ½ of that of the metallic shielding plate 40. In FIG. 2, each connection 30 has its entire region formed more thinly than each metallic shielding plate 40. However, the above does not limit the preferable thickness of the connection 30 and at least a section thereof that is adjacent to the metallic shielding plate 40 can be thinner than the shielding plate 40. For example, width of the etching space 31 can be nearly ½ of that of the connection 30, as shown in FIGS. 3(a) and 3(c), or the width of the etching space 31 can be nearly ¾ of that of the connection 30, as shown in FIGS. 3(b) and 3(d).

(Configuration of the Metallic Shielding Plate)

Next, the metallic shielding plate 40 is outlined below in accordance with FIGS. 4(a) and 4(b).

The metallic shielding plate 40 for semiconductor devices, shown in FIGS. 4(a) and 4(b), is included in the metallic shielding sheet 10 described above. That is to say, the metallic shielding plate 40 is fabricated by, as will be described later herein, cutting the corresponding connection 30 on the metallic shielding sheet 10 and separating the metallic shielding plate 40 from the frame body 20.

The thus-constructed metallic shielding plate 40 has a rectangular shielding plate body 41 including a first surface 41A and a second surface 41B, and burrs protruding sideward from the shielding plate body 41. More specifically, the burrs are residues 42 that are left after connections 30 have been cut.

The burrs 42 are each positioned contiguous to the second surface 41B of the shielding plate body 41, and each includes a first surface 42A and a second surface 42B. That is to say, the second surface 42B of each burr 42 is provided to be flush with the second surface 41B of the shielding plate body 41. The first surface 42A of the burr 42, however, is positioned between the second surface 41B of the shielding plate body 41 and the first surface 41A thereof. This means that the burr 42 is thinner than the shielding plate body 41. The burr 42 is equivalent to a part of one connection 30 on the metallic shielding sheet 10.

FIG. 4(a) illustrates the metallic shielding plate 40 existing after cutting of the corresponding connections 30 at the second surface 41B of the shielding plate body 41. The as-cut state of one connection 30 is shown in FIGS. 18(a) and 18(b). At a distal end of each burr 42 in FIG. 4(a), a sharp burr 43 is formed in a direction orthogonal to the surfaces 41B and 42B. In this case, the sharp burr 43 extends in a direction opposite to a particular cutting direction of the corresponding connection 30, that is, in a direction of the first surface 41A of the shielding plate body 41, or downward in FIG. 4(a).

FIG. 4(b) illustrates the metallic shielding plate 40 existing after cutting of the corresponding connections 30 at the first surface 41A of the shielding plate body 41. The as-cut state of one connection 30 is shown in FIGS. 19(a) and 19(b). At the distal end of each burr 42 in FIG. 4(b), the sharp burr 43 is formed in the direction orthogonal to the surfaces 41B and 42B. In this case, the sharp burr 43 extends in the direction opposite to a particular cutting direction of the corresponding connection 30, that is, in a direction of the second surface 41B of the shielding plate body 41, or upward in FIG. 4(b).

Approximate heights of the sharp burrs 43 in FIGS. 4(a) and 4(b) are between about 20 µm and 30 µm.

The metallic shielding plate 40 is dimensionally not defined. However, because of there being no need, as will be described later herein, to manually mount the metallic shielding plate 40 on a special tray before manufacturing a semiconductor device, one side of the metallic shielding plate 40 can be dimensionally reduced to a range nearly between, for example, 1 mm and 3 mm. Additionally, the thickness of the metallic shielding plate 40 may preferably be between 50 μm and 200 μm, and further preferably between 100 μm and 150 μm. If the thickness of the metallic shielding plate 40 is less than 50 μm, this thickness is insufficient for protecting semiconductor chips from external magnetism. Conversely if the thickness of the metallic shielding plate 40 exceeds 200 μm, this is not preferable for achieving the above object, since the entire semiconductor device will be too thick.

(Semiconductor Device Configurations)

Next, semiconductor devices according to the present invention will be outlined in accordance with FIGS. 5 to 16. Semiconductor devices including one metallic shielding plate are first outlined below using FIGS. 5 to 7.

FIGS. 5(a), 6(a), and 7(a) illustrate semiconductor devices formed as SOPs (short for Small Outline Packages), FIGS. 5(b), 6(b), and 7(b) illustrate semiconductor devices formed as BGAs (short for Ball GridArray Packages), and FIGS. 5(c), 5(d), 6(c), 6(d), 7(c), and 7(d) illustrate semiconductor devices formed as DFNs (short for Dual Flat No-lead Packages).

The SOP type of semiconductor device 50 shown in FIG. 5(a) includes a die pad (substrate) 52, a semiconductor chip 51 mounted on the die pad 52 and having a circuit surface 51A, and a metallic shielding plate 40 provided on the circuit surface 51A of the semiconductor chip 51. The semiconductor chip 51 includes a semiconductor memory such as an MRAM, inclusive of a storage element that exhibits a magnetoresistive effect.

As described above, the metallic shielding plate 40 has a shielding plate body 41 including a first surface 41A and a second surface 41B, and burrs 42 protruding sideward from the shielding plate body 41. The burrs 42 are each positioned contiguous to the second surface 41B of the shielding plate body 41. Also, the metallic shielding plate 40 is disposed so as to direct the second surface 41B of the shielding plate body 41 towards the circuit surface 51A of the semiconductor chip 51.

Additionally, the circuit surface 51A, and lead frames 54, of the semiconductor chip 51 are electrically interconnected via bonding wires 55 made of gold. Furthermore, the die pad 52, the semiconductor chip 51, the metallic shielding plate 40, and the bonding wires 55 are sealed with a sealing resin 56.

As shown in FIG. 5(a), the metallic shielding plate 40 is mounted on the semiconductor chip 51 so that the burrs 42 abut the circuit surface 51A of the semiconductor chip 51. The metallic shielding plate 40 used in this case has sharp burrs 43 that extend towards the first surface 41A, as shown in FIG. 4(a). As a result, the sharp burrs 43 extend in a direction opposite to the semiconductor chip 51. This renders the circuit surface 51A of the semiconductor chip 51 unlikely to be damaged by the sharp burrs 43 of the metallic shielding plate 40 during the manufacture of the semiconductor device 50.

Meanwhile, the BGA type of semiconductor device 60 shown in FIG. 5(b) includes a package substrate 67, a die pad (substrate) 62 provided on the package substrate 67, a semiconductor chip 61 mounted on the die pad 62 and having a circuit surface 61A, and a metallic shielding plate 40 provided on the circuit surface 61A of the semiconductor chip 61. The semiconductor chip 61, as with the above-described semiconductor chip 51, includes a semiconductor memory such as an MRAM, inclusive of a storage element that exhibits a magnetoresistive effect.

As described above, the metallic shielding plate 40 of the semiconductor device 60 has a shielding plate body 41 including a first surface 41A and a second surface 41B, and burrs 42 protruding sideward from the shielding plate body 41. The burrs 42 are each positioned contiguous to the second surface 41B of the shielding plate body 41. Also, the metallic shielding plate 40 is disposed so as to direct the second surface 41B of the shielding plate body 41 towards the circuit surface 61A of the semiconductor chip 61.

Additionally, the package substrate 67 has terminals 64 thereon, with solder balls 68 being electrically connected to the terminals 64. The solder balls 68 each protrude outward from the package substrate 67. Furthermore, the terminals 64 and the circuit surface 61A of the semiconductor chip 61 are electrically interconnected via bonding wires 65 made of gold. Moreover, the die pad 62, the semiconductor chip 61, the metallic shielding plate 40, the terminals 64, and the bonding wires 65 are sealed with a sealing resin 66.

As shown in FIG. 5(b), the metallic shielding plate 40 is mounted on the semiconductor chip 61 so that the burrs 42 abut the circuit surface 61A of the semiconductor chip 61. The metallic shielding plate 40 used in this case has sharp burrs 43 that extend towards the first surface 41A, as shown in FIG. 4(a). As a result, the sharp burrs 43 extend in a direction opposite to the semiconductor chip 61. This renders the circuit surface 61A of the semiconductor chip 61 unlikely to be damaged by the sharp burrs 43 of the metallic shielding plate 40 during the manufacture of the semiconductor device 60.

The DFN type of semiconductor device 90 shown in FIG. 5(c) includes a die pad (substrate) 92, a semiconductor chip 91 mounted on the die pad 92 and having a circuit surface 91A, and a metallic shielding plate 40 provided on the circuit surface 91A of the semiconductor chip 91. The semiconductor chip 91, as with the above-described semiconductor chips 51 and 61, includes a semiconductor memory such as an MRAM, inclusive of a storage element that exhibits a magnetoresistive effect.

As described above, the metallic shielding plate 40 of the semiconductor device 90 has a shielding plate body 41 including a first surface 41A and a second surface 41B, and burrs 42 protruding sideward from the shielding plate body 41. The burrs 42 are each positioned contiguous to the second surface 41B of the shielding plate body 41. Also, the metallic shielding plate 40 is disposed so as to direct the second surface 41B of the shielding plate body 41 towards the circuit surface 91A of the semiconductor chip 91.

Additionally, the circuit surface 91A, and lead frames 94, of the semiconductor chip 91 are electrically interconnected via bonding wires 95 made of gold. Furthermore, part of the die pad 92, part of the lead frames 94, the semiconductor chip 91, the metallic shielding plate 40, and the bonding wires 95 are sealed with a sealing resin 96.

As shown in FIG. 5(c), the metallic shielding plate 40 is mounted on the semiconductor chip 91 so that the burrs 42 abut the circuit surface 91A of the semiconductor chip 91. The metallic shielding plate 40 used in this case has sharp burrs 43 that extend towards the first surface 41A, as shown in FIG. 4(a). As a result, the sharp burrs 43 extend in a direction opposite to the semiconductor chip 91. This renders the circuit surface 91A of the semiconductor chip 91 unlikely to be damaged by the sharp burrs 43 of the metallic shielding plate 40 during the manufacture of the semiconductor device 90.

As shown in FIG. 5(d), the die pad 92, each lead frame 94, and the sealing resin 96 may be positioned so that respective lower surfaces are flush with one another. Other configurational factors of the semiconductor device 90 shown in FIG. 5(d) are the same as those of the semiconductor device 90 shown in FIG. 5(c).

In FIGS. 5(a) to 5(d), the metallic shielding plate 40 is disposed so as to direct the second surface 41B to the circuit surfaces 51A, 61A, and 91A of the semiconductor chips 51, 61, and 91. However, this does not limit a disposition form of the metallic shielding plate 40; as shown in FIGS. 6(a) to 6(d) and 7(a) to 7(d), the metallic shielding plate 40 may be disposed in such a manner that the first surface 41A is directed towards the circuit surfaces 51A, 61A, and 91A of the semiconductor chips 51, 61, and 91.

The direction of the sharp burrs 43 of the metallic shielding plate 40 is not defined in that case. That is to say, as shown in FIGS. 6(a) to 6(d), the sharp burrs 43 may extend towards the semiconductor chips 51, 61, and 91. If this is the case, the sharp burrs 43 do not extend above the second surface 41B of the metallic shielding plate 40 and thus the sealing resin 56, 66, and 96 formed above the metallic shielding plate 40 can be thinned down for reduced thickness of the entire semiconductor devices 50, 60, and 90. In addition, for a packaged structure having the package substrate 67 or die pad 92 resin-molded only on one surface thereof as shown in FIGS. 6(b) to 6(d), the extending of the sharp burrs 43 in the above direction improves adhesion of the sealing resin 66 and 96, hence becoming effective for preventing the sealing resin 66 and 96 from peeling off from the package substrate 67 or the die pad 92.

Alternatively as shown in FIGS. 7(a) to 7(d), the sharp burrs 43 may extend in the direction opposite to the semiconductor chips 51, 61, and 91. If this is the case, since the sharp burrs 43 are formed to face upward, even when the terminals of the semiconductor chips 51, 61, and 91 are in proximity to the burrs 42, wire bonding is facilitated and wire-bonding connection reliability improves.

In any of the above cases, the sharp burrs 43 are positioned away from the circuit surfaces 51A, 61A, and 91A of the semiconductor chips 51, 61, and 91. The sharp burrs 43 are therefore unlikely to damage the circuit surface 91A of the semiconductor chip 91. In FIGS. 6(a) to 6(d) and FIGS. 7(a) to 7(d), the same sections as those of the embodiment shown in FIGS. 5(a) to 5(d) are each assigned the same reference number.

Figure 5:
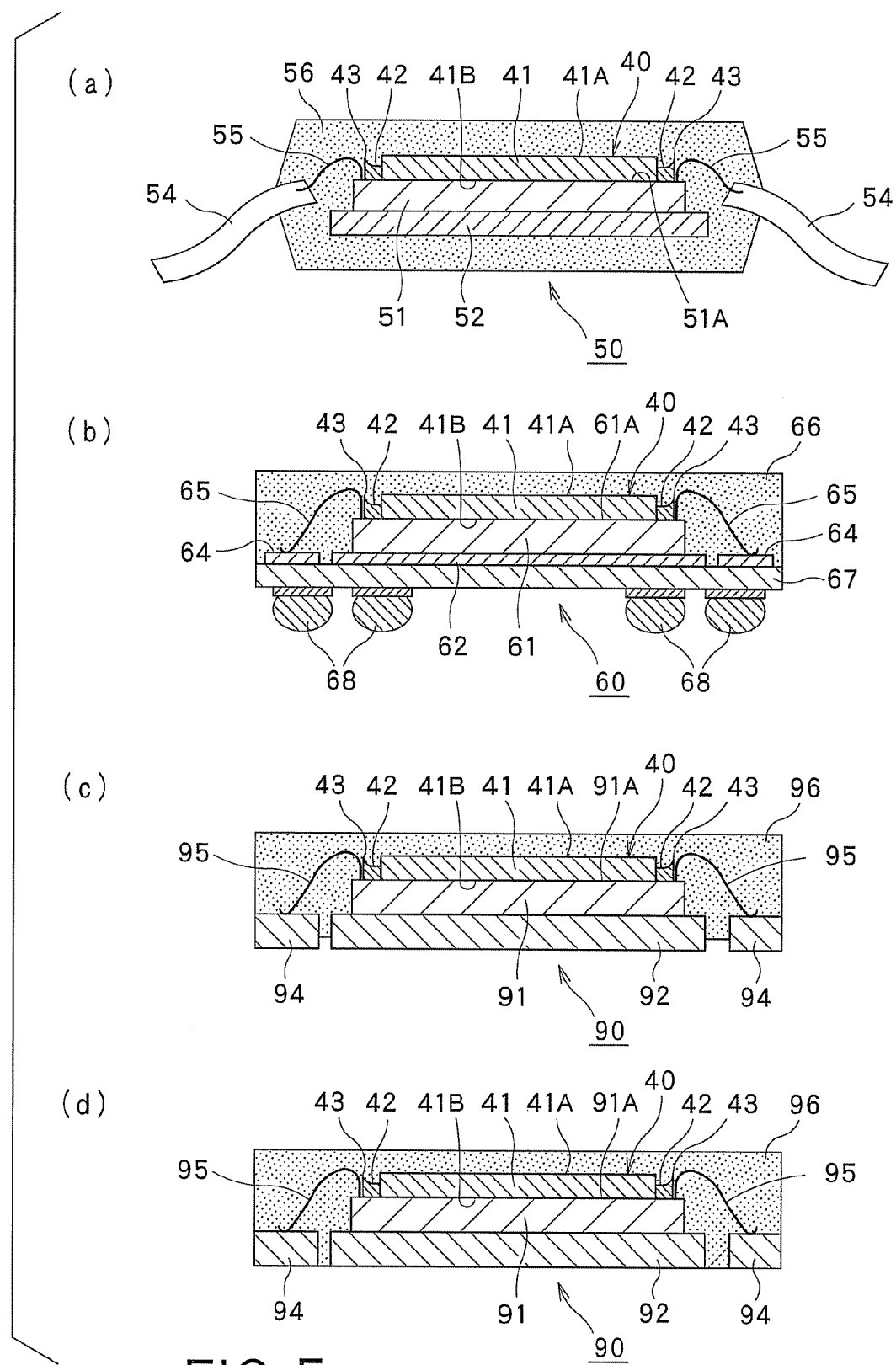
FIGS. 5(a) to 5(d) are schematic diagrams that illustrate different examples of a semiconductor device (including one metallic shielding plate) in a first embodiment of the present invention.
Figure 6:
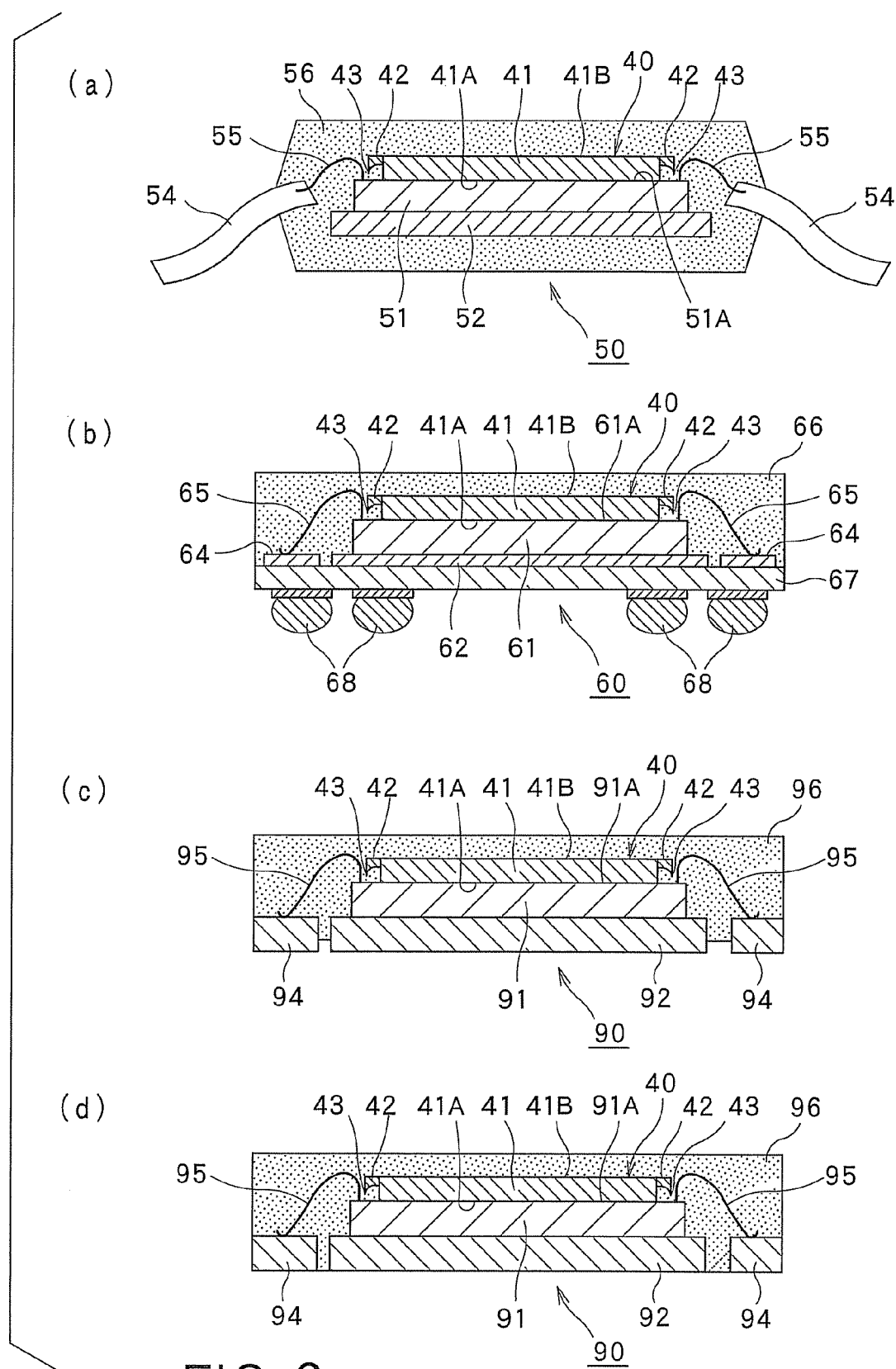
FIGS. 6(a) to 6(d) are schematic diagrams that illustrate different variations of the semiconductor device shown in FIGS. 5(a) to 5(d)
Figure 7:
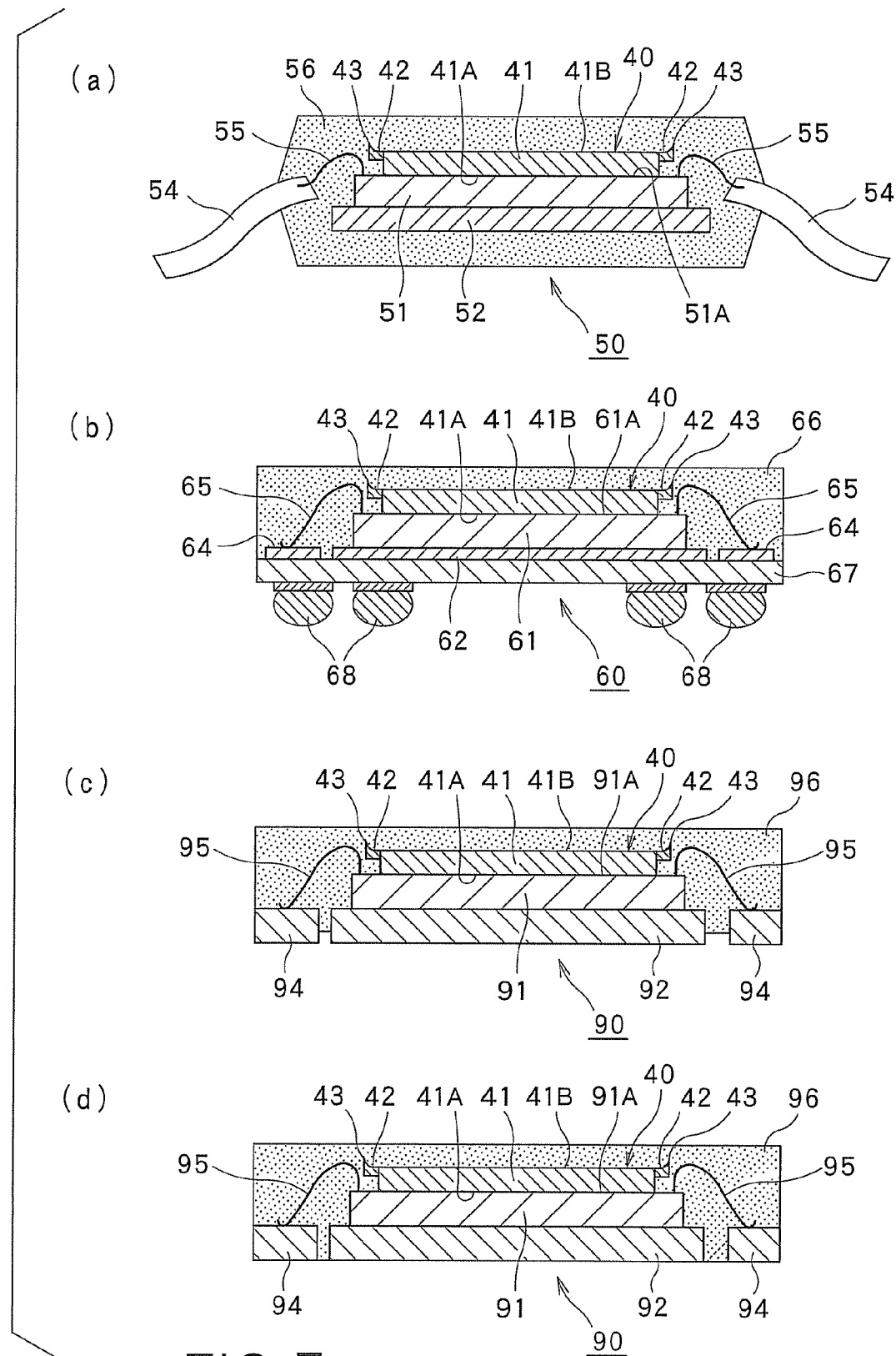
FIGS. 7(a) to 7(d) are schematic diagrams that illustrate other different variations of the semiconductor device shown in FIGS. 5(a) to 5(d)
Figure 8:
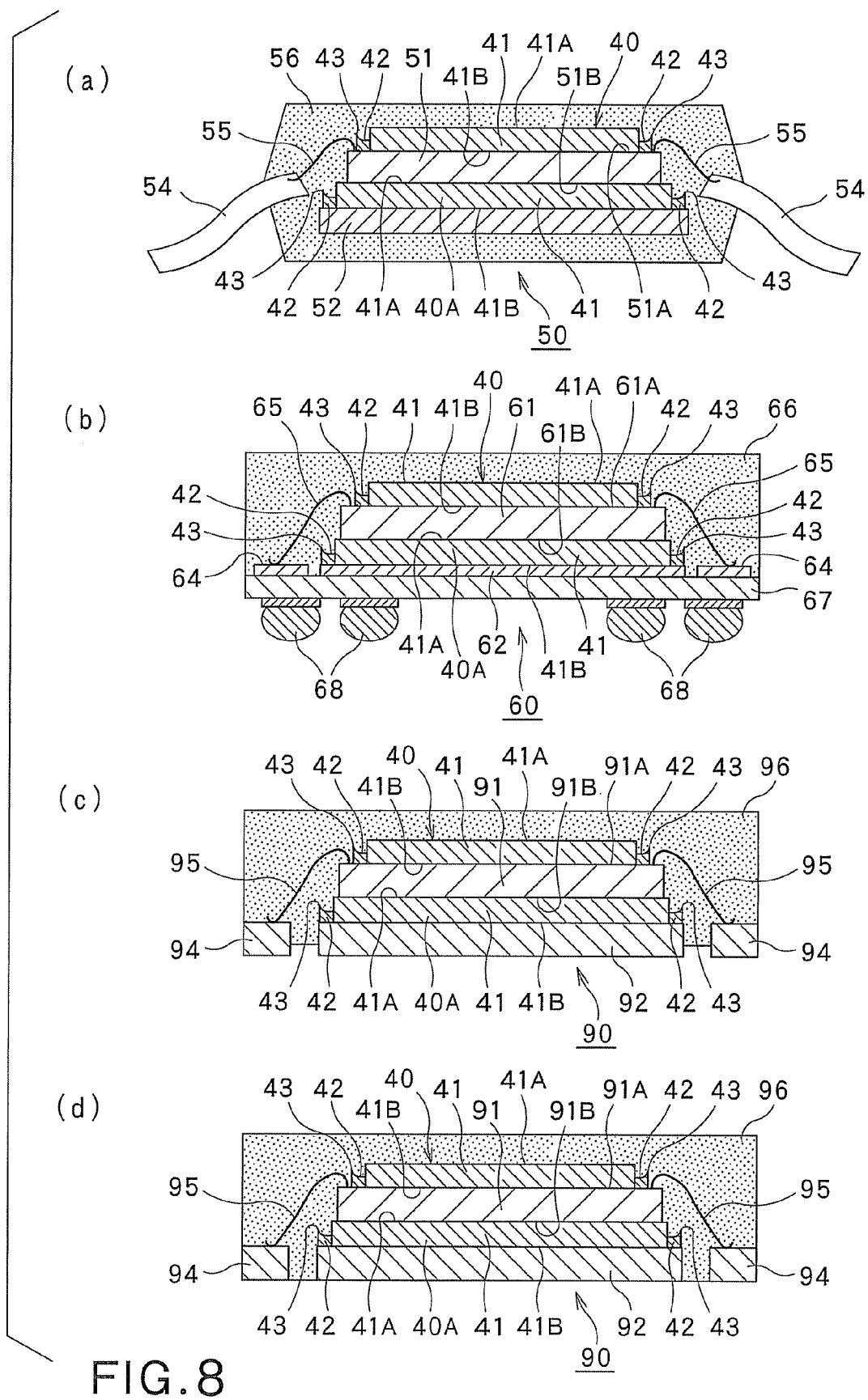
FIGS. 8(a) to 8(d) are other schematic diagrams that illustrate different examples of a semiconductor device (including two metallic shielding plates) in the first embodiment of the present invention.
Figure 9:
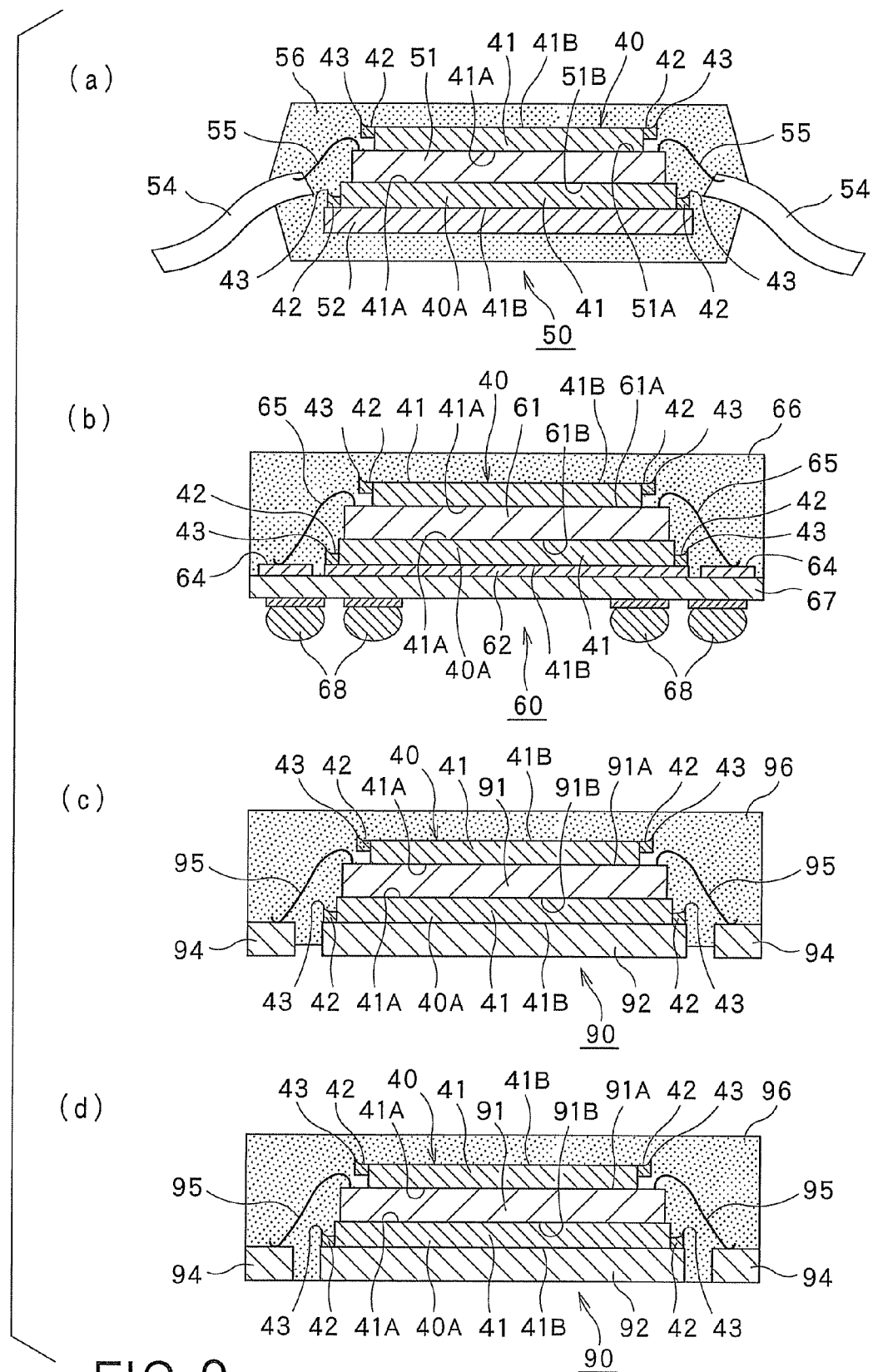
FIGS. 9(a) to 9(d) are schematic diagrams that illustrate different variations of the semiconductor device shown in FIGS. 8(a) to 8(d)
Figure 10:
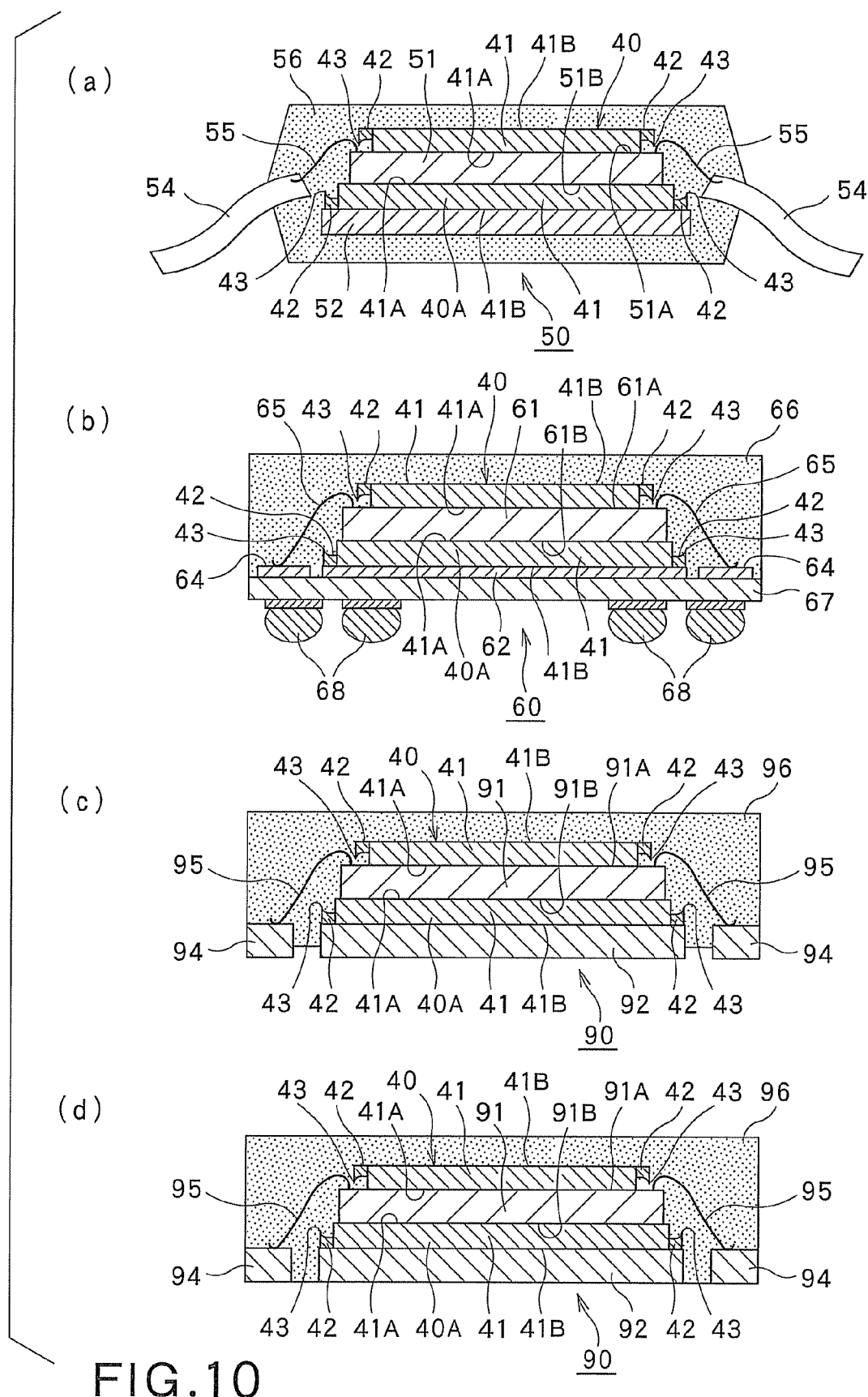
FIGS. 10(a) to 10(d) are schematic diagrams that illustrate other different variations of the semiconductor device shown in FIGS. 8(a) to 8(d)

Referring to FIGS. 5 to 7, one metallic shielding plate 40 is provided on the circuit surfaces 51A, 61A, and 91A of the semiconductor chips 51, 61, and 91. However, this does not limit a disposition form of the metallic shielding plate 40; as shown in FIGS. 8 to 16, in addition to the metallic shielding plate on the circuit surfaces 51A, 61A, and 91A of the semiconductor chips 51, 61, and 91, another metallic shielding plate 40A may be provided on an opposite surfaces 51B, 61B, and 91B of the semiconductor chips 51, 61, and 91 with respect to the circuit surfaces 51A, 61A, and 91A. Hereinafter, the added metallic shielding plate 40A on the opposite surfaces 51B, 61B, and 91B with respect to the circuit surfaces 51A, 61A, and 91A, will be referred to as first metallic shielding plate 40A, and the metallic shielding plate 40 on the circuit surfaces 51A, 61A, and 91A, as second metallic shielding plate 40.

The semiconductor devices 50, 60, and 90 shown in FIGS. 8 to 16 differ from those of FIGS. 5 to 7 in that each includes two metallic shielding plates, 40 and 40A. Other configurational factors of the former semiconductor devices 50, 60, and 90 are substantially the same as those of the latter semiconductor devices 50, 60, and 90. In FIGS. 8 to 16, the same sections as those of the embodiment shown in FIGS. 5 to 7 are each assigned the same reference number, and detailed description of the same sections is omitted.

More specifically, as shown in FIGS. 8 to 16, the semiconductor devices 50, 60, and 90 each include a substrates (or die pad) 52, 62, and 92, a first metallic shielding plate 40A provided on the substrates 52, 62, and 92, and a semiconductor chips 51, 61, and 91 provided on the first metallic shielding plate 40A and having a circuit surfaces 51A, 61A, and 91A. A second metallic shielding plate 40 is provided on the circuit surfaces 51A, 61A, and 91A of the semiconductor chips 51, 61, and 91.

Configurations of the first metallic shielding plate 40A and second metallic shielding plate 40 shown in FIGS. 8 to 16 are substantially the same as the configuration of the metallic shielding plate 40 that has been described using FIGS. 4(a) and 4(b).

That is to say, the first metallic shielding plate 40A has a shielding plate body 41 including a first surface 41A and a second surface 41B, and burrs 42 protruding sideward from the shielding plate body 41. The burrs 42 are each positioned contiguous to the second surface 41B of the shielding plate body 41. Also, at distal ends of the burrs 42, sharp burrs 43 are formed in a direction orthogonal to the second surface 41B.

Similarly, the second metallic shielding plate 40 has a shielding plate body 41 including a first surface 41A and a second surface 41B, and burrs 42 protruding sideward from the shielding plate body 41. The burrs 42 are each positioned contiguous to the second surface 41B of the shielding plate body 41. Also, at distal ends of the burrs 42, sharp burrs 43 are formed in a direction orthogonal to the second surface 41B.

Next, the semiconductor device configurations shown in FIGS. 8 to 16 will be detailed, with focus placed particularly upon a positional relationship between the first metallic shielding plate 40A and the second metallic shielding plate 40.

Referring to FIGS. 8(a) to 8(d), the first metallic shielding plate 40A is disposed with the second surface 41B directed towards the substrates 52, 62, and 92. The sharp burrs 43 on the first metallic shielding plate 40A extend in a direction opposite to the substrates 52, 62, and 92, as shown in FIG. 4(a). The second metallic shielding plate 40 is disposed with the second surface 41B directed towards the semiconductor chips 51, 61, and 91. The sharp burrs 43 on the second metallic shielding plate 40 extend in a direction opposite to the semiconductor chips 51, 61, and 91, as shown in FIG. 4(a).

Referring to FIGS. 9(a) to 9(d), the first metallic shielding plate 40A is disposed with the second surface 41B directed towards the substrates 52, 62, and 92. The sharp burrs 43 on the first metallic shielding plate 40A extend in a direction opposite to the substrates 52, 62, and 92, as shown in FIG. 4(a). The second metallic shielding plate 40 is disposed with the first surface 41A directed towards the semiconductor chips 51, 61, and 91. The sharp burrs 43 on the second metallic shielding plate 40 extend in a direction opposite to the semiconductor chips 51, 61, and 91, as shown in FIG. 4(b). In this case, since the sharp burrs 43 are formed to face upward, even when the terminals of the semiconductor chips 51, 61, and 91 are in proximity to the burrs 42, wire bonding is facilitated and wire-bonding connection reliability improves.

Referring to FIGS. 10(a) to 10(d), the first metallic shielding plate 40A is disposed with the second surface 41B directed towards the substrates 52, 62, and 92. The sharp burrs 43 on the first metallic shielding plate 40A extend in a direction opposite to the substrates 52, 62, and 92, as shown in FIG. 4(a). The second metallic shielding plate 40 is disposed with the first surface 41A directed towards the semiconductor chips 51, 61, and 91. The sharp burrs 43 on the second metallic shielding plate 40 extend towards the semiconductor chips 51, 61, and 91, as shown in FIG. 4(a). In this case, the sharp burrs 43 do not extend above the second surface 41B of the metallic shielding plate 40 and thus the sealing resin 56, 66, and 96 formed above the metallic shielding plate 40 can be thinned down for reduced thickness of the entire semiconductor devices 50, 60, and 90. In addition, for a packaged structure having the package substrate 67 or die pad 92 resin-molded only on one surface thereof as shown in FIGS. 10(*b*) to 10(*d*), the extending of the sharp burrs 43 in the above direction improves adhesion of the sealing resin 66 and 96, hence becoming effective for preventing the sealing resin 66 and 96 from peeling off from the package substrate 67 or the die pad 92.

Figure 4:
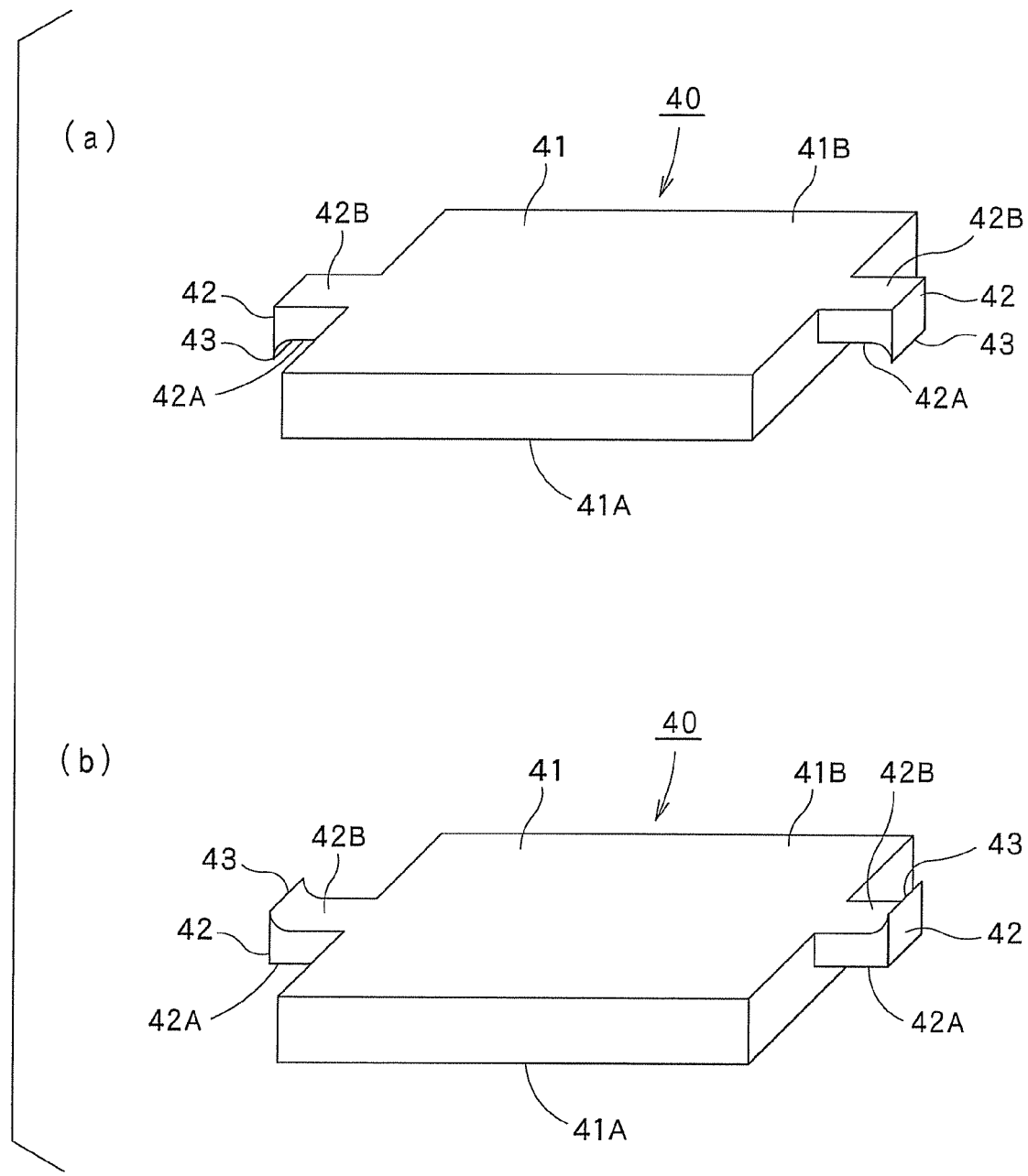
FIGS. 4(a) and 4(b) are perspective views of different metallic shielding plates.
Figure 11:
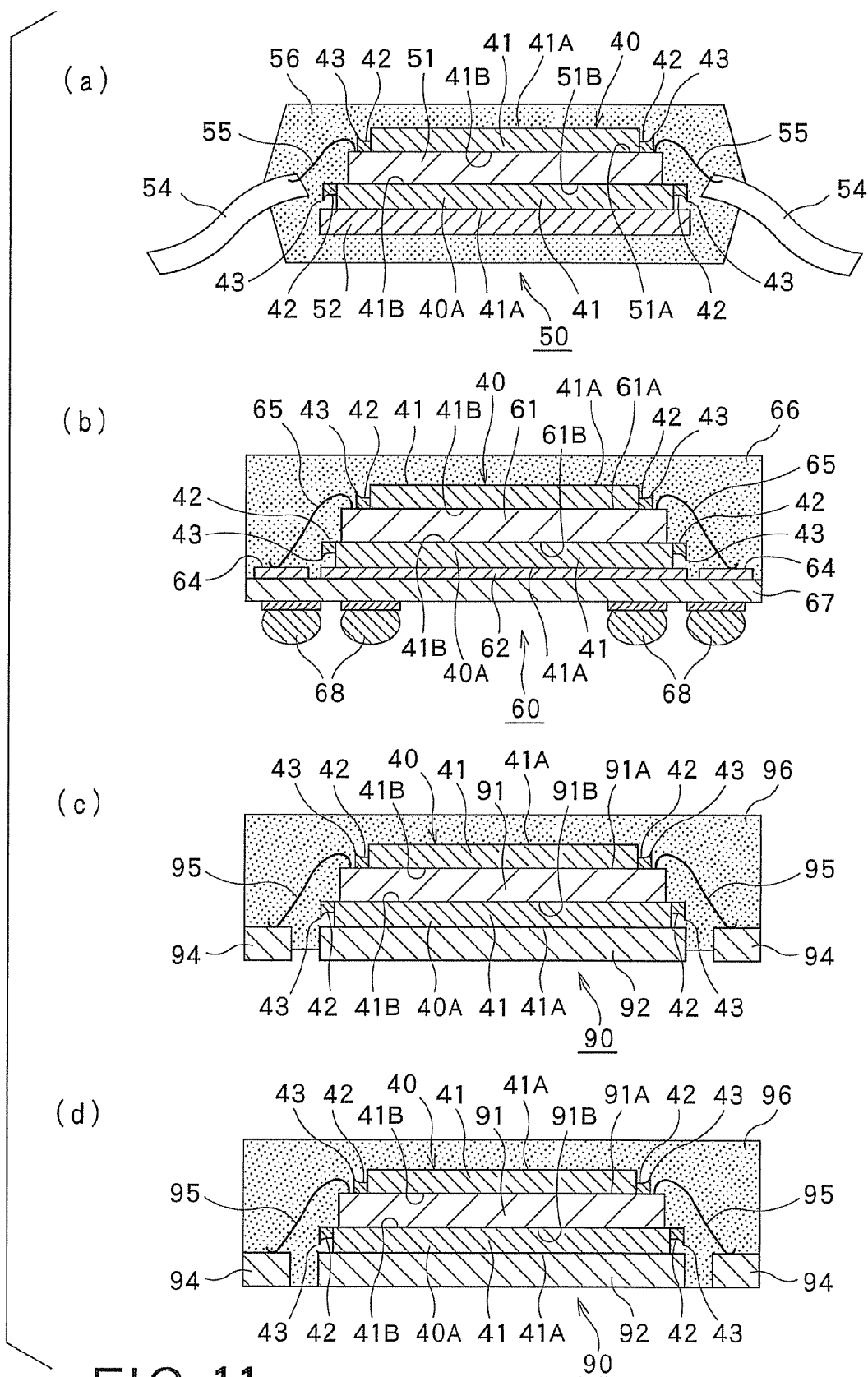
FIGS. 11(a) to 11(d) are schematic diagrams that illustrate further, different variations of the semiconductor device shown in FIGS. 8(a) to 8(d)

Referring to FIGS. 11(*a*) to 11(*d*), the first metallic shielding plate 40A is disposed with the first surface 41A directed towards the substrates 52, 62, and 92. The sharp burrs 43 on the first metallic shielding plate 40A extend towards the substrates 52, 62, and 92, as shown in FIG. 4(*a*). The second metallic shielding plate 40 is disposed with the second surface 41B directed towards the semiconductor chips 51, 61, and 91. The sharp burrs 43 on the second metallic shielding plate 40 extend in a direction opposite to the semiconductor chips 51, 61, and 91, as shown in FIG. 4(*a*).

Figure 12:
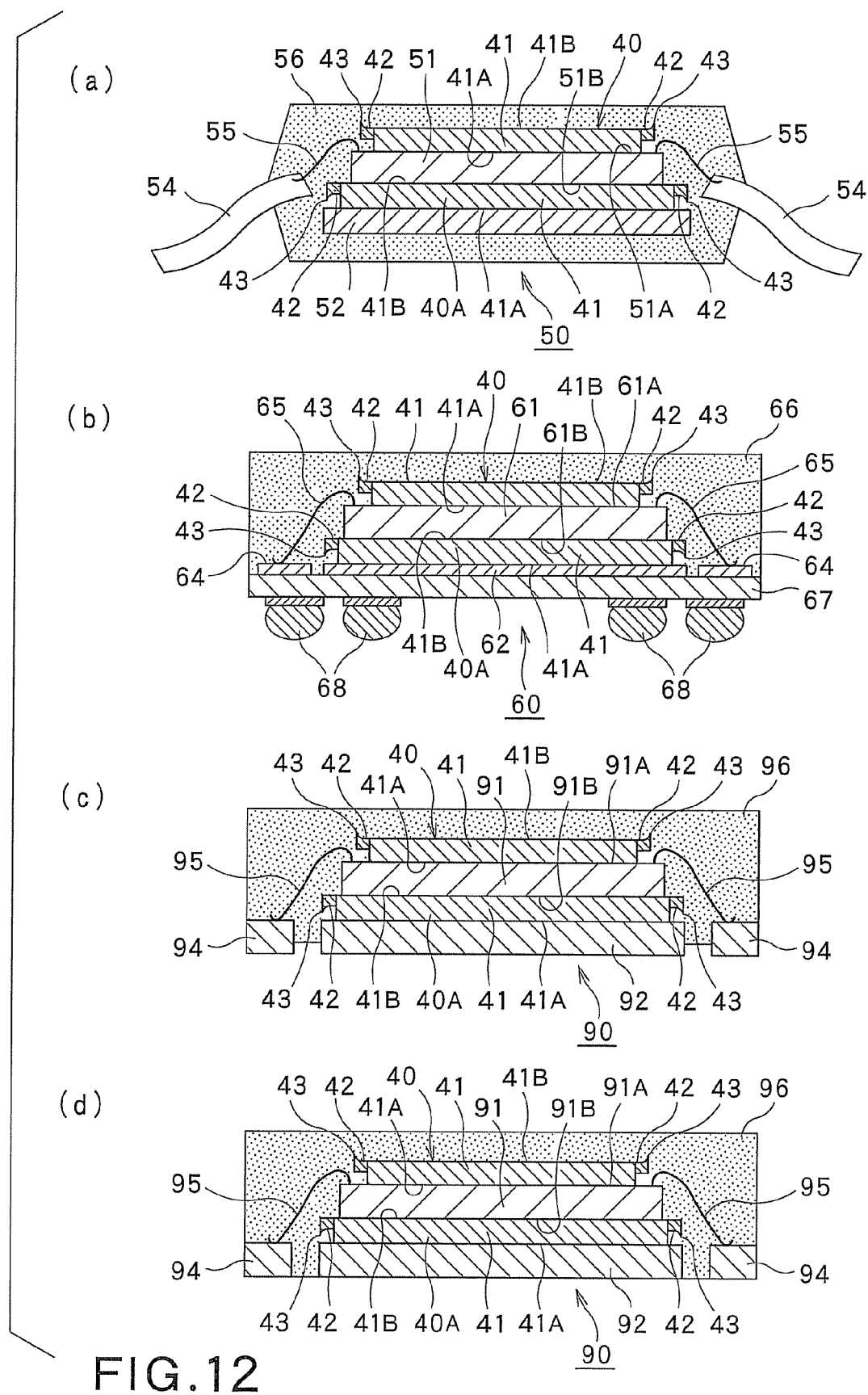
FIGS. 12(a) to 12(d) are schematic diagrams that illustrate further, other different variations of the semiconductor device shown in FIGS. 8(a) to 8(d)

Referring to FIGS. 12(*a*) to 12(*d*), the first metallic shielding plate 40A is disposed with the first surface 41A directed towards the substrates 52, 62, and 92. The sharp burrs 43 on the first metallic shielding plate 40A extend towards the substrates 52, 62, and 92, as shown in FIG. 4(*a*). The second metallic shielding plate 40 is disposed with the first surface 41A directed towards the semiconductor chips 51, 61, and 91. The sharp burrs 43 on the second metallic shielding plate 40 extend in a direction opposite to the semiconductor chips 51, 61, and 91, as shown in FIG. 4(*b*). In this case, since the sharp burrs 43 are formed to face upward, even when the terminals of the semiconductor chips 51, 61, and 91 are in proximity to the burrs 42, wire bonding is facilitated and wire-bonding connection reliability improves.

Figure 13:
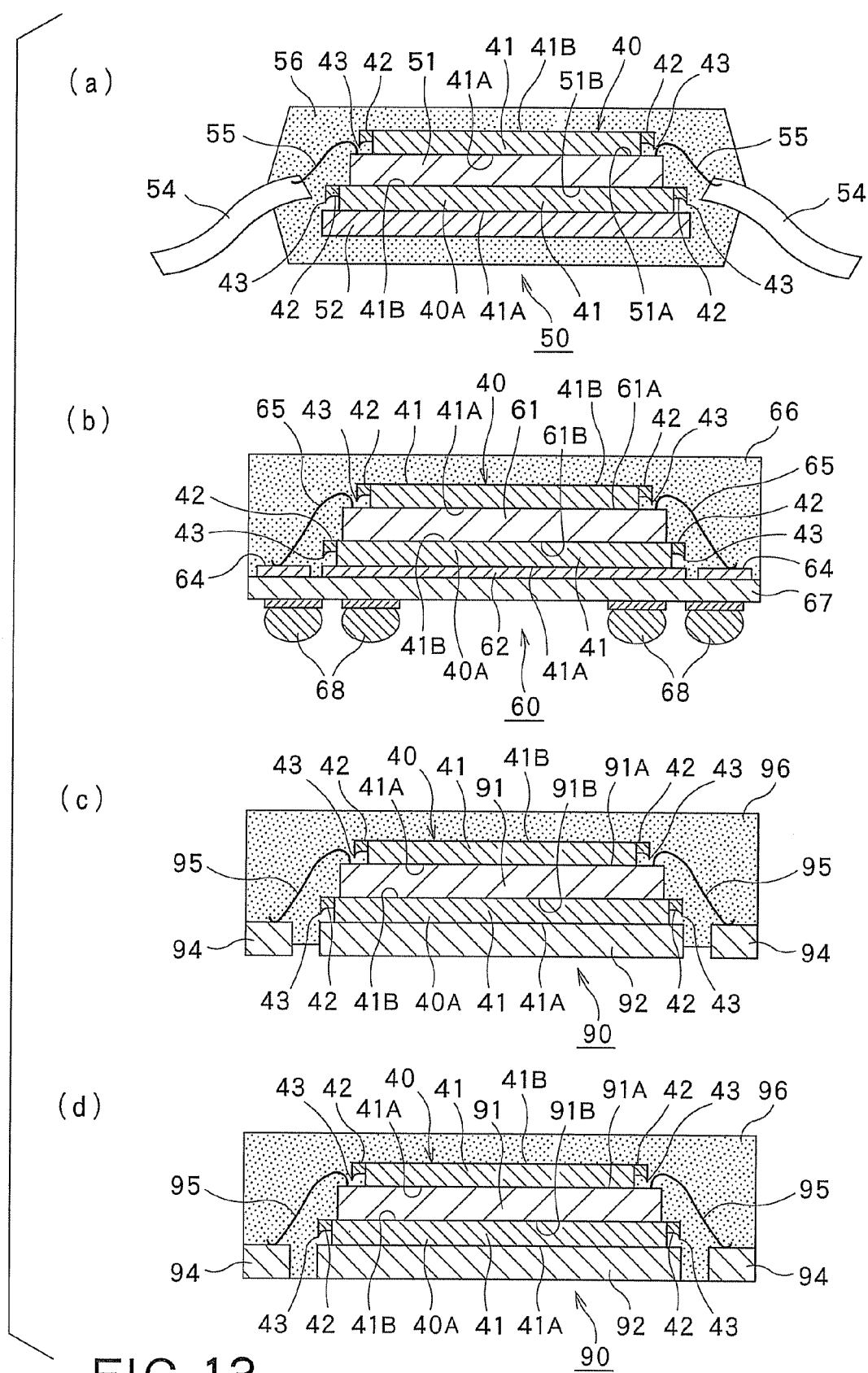
FIGS. 13(a) to 13(d) are schematic diagrams that illustrate further, different variations of the semiconductor device shown in FIGS. 8(a) to 8(d)

Referring to FIGS. 13(*a*) to 13(*d*), the first metallic shielding plate 40A is disposed with the first surface 41A directed towards the substrates 52, 62, and 92. The sharp burrs 43 on the first metallic shielding plate 40A extend towards the substrates 52, 62, and 92, as shown in FIG. 4(*a*). The second metallic shielding plate 40 is disposed with the first surface 41A directed towards the semiconductor chips 51, 61, and 91. The sharp burrs 43 on the second metallic shielding plate 40 extend towards the semiconductor chips 51, 61, and 91, as shown in FIG. 4(*a*). In this case, the sharp burrs 43 do not extend above the second surface 41B of the metallic shielding plate 40 and thus the sealing resin 56, 66, and 96 formed above the metallic shielding plate 40 can be thinned down for reduced thickness of the entire semiconductor devices 50, 60, and 90. In addition, for a packaged structure having the package substrate 67 or die pad 92 resin-molded only on one surface thereof as shown in FIGS. 13(*b*) to 13(*d*), the extending of the sharp burrs 43 in the above direction improves adhesion of the sealing resin 66 and 96, hence becoming effective for preventing the sealing resin 66 and 96 from peeling off from the package substrate 67 or the die pad 92.

Figure 14:
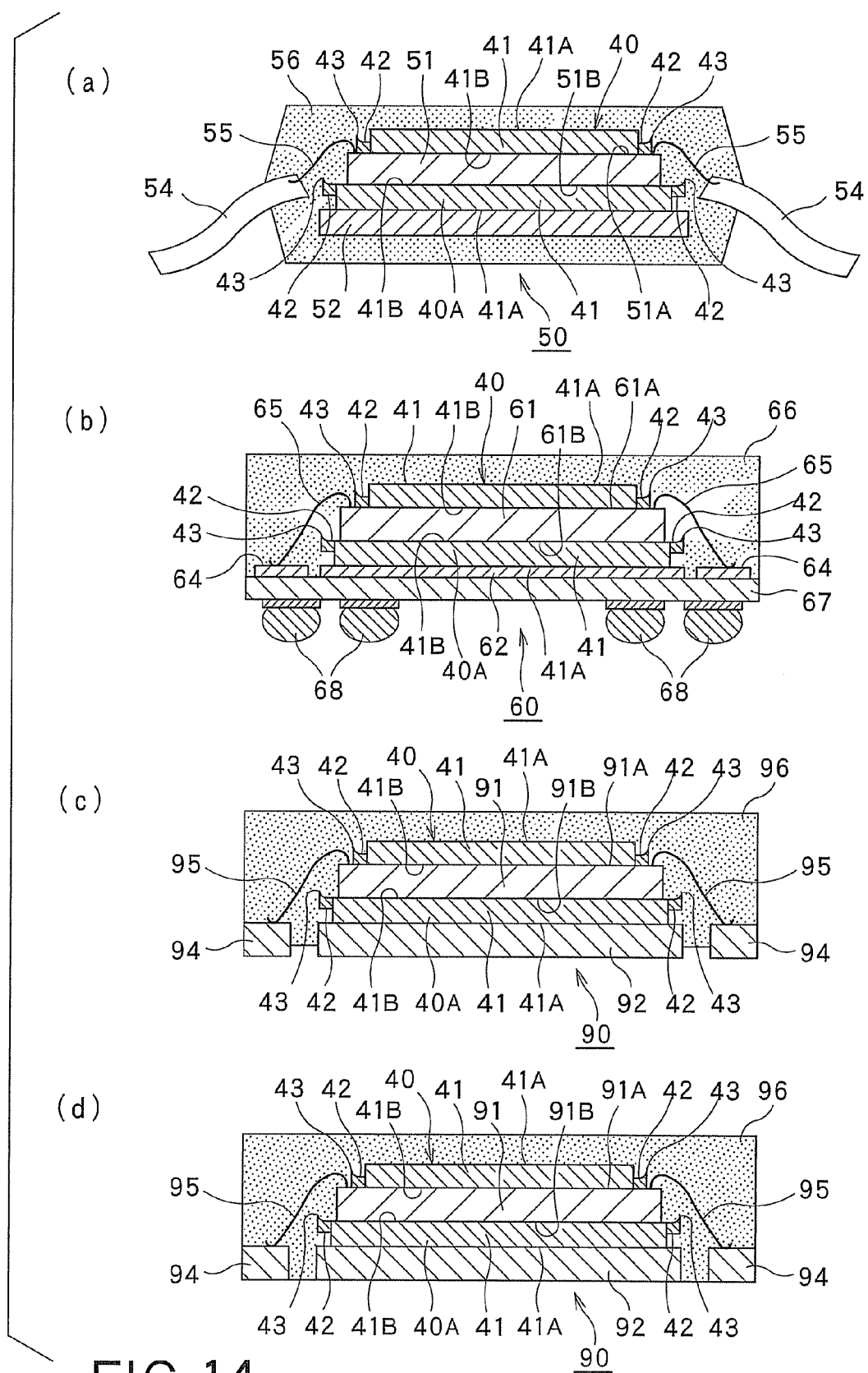
FIGS. 14(a) to 14(d) are schematic diagrams that illustrate further, other different variations of the semiconductor device shown in FIGS. 8(a) to 8(d)

Referring to FIGS. 14(*a*) to 14(*d*), the first metallic shielding plate 40A is disposed with the first surface 41A directed towards the substrates 52, 62, and 92. The sharp burrs 43 on the first metallic shielding plate 40A extend in a direction opposite to the substrates 52, 62, and 92, as shown in FIG. 4(*b*). The second metallic shielding plate 40 is disposed with the second surface 41B directed towards the semiconductor chips 51, 61, and 91. The sharp burrs 43 on the second metallic shielding plate 40 extend in a direction opposite to the semiconductor chips 51, 61, and 91, as shown in FIG. 4(*a*).

Figure 15:
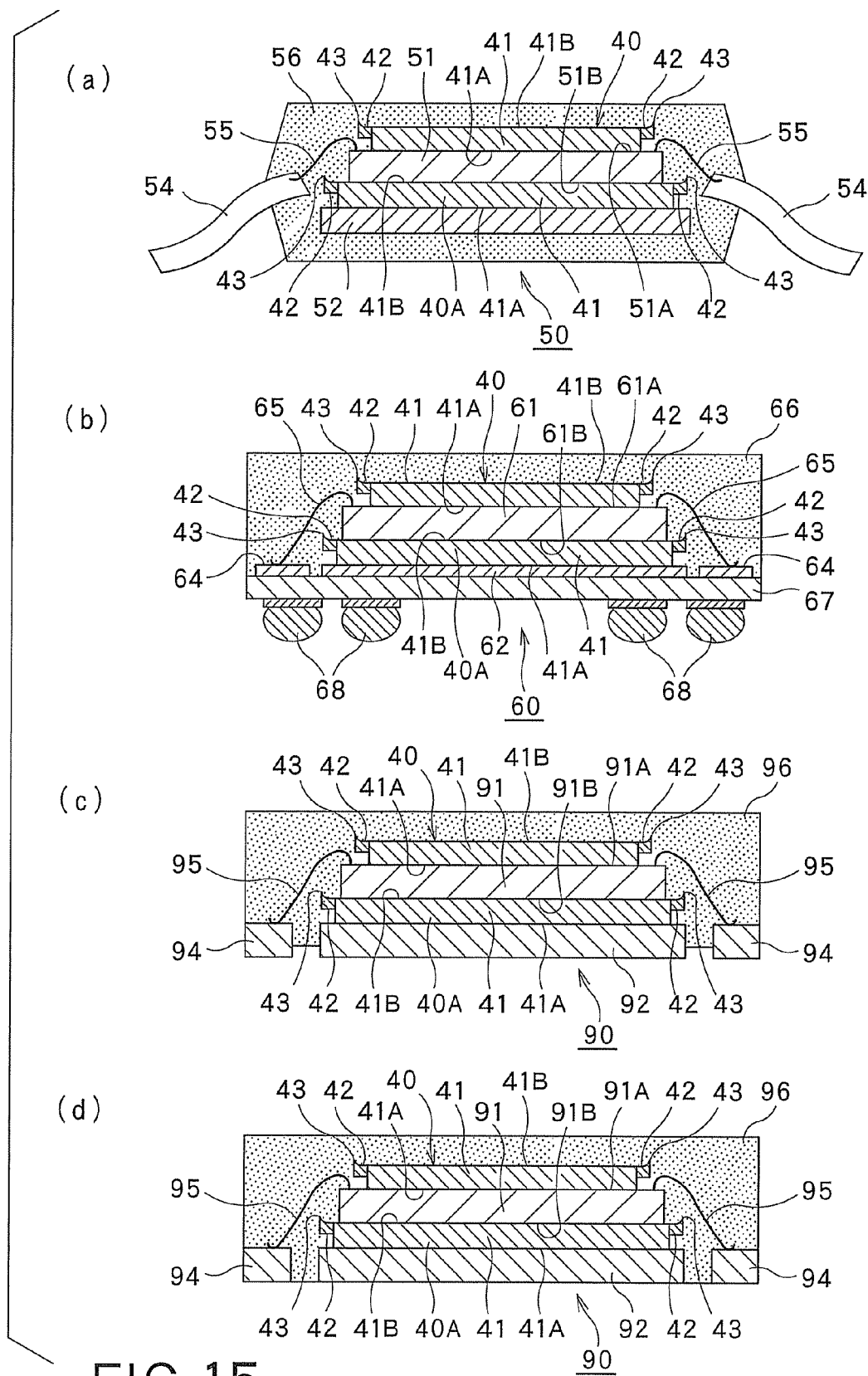
FIGS. 15(a) to 15(d) are schematic diagrams that illustrate further, different variations of the semiconductor device shown in FIGS. 8(a) to 8(d)

Referring to FIGS. 15(*a*) to 15(*d*), the first metallic shielding plate 40A is disposed with the first surface 41A directed towards the substrates 52, 62, and 92. The sharp burrs 43 on the first metallic shielding plate 40A extend in a direction opposite to the substrates 52, 62, and 92, as shown in FIG. 4(*b*). The second metallic shielding plate 40 is disposed with the first surface 41A directed towards the semiconductor chips 51, 61, and 91. The sharp burrs 43 on the second metallic shielding plate 40 extend in a direction opposite to the semiconductor chips 51, 61, and 91, as shown in FIG. 4(*b*). In this case, since the sharp burrs 43 are formed to face upward, even when the terminals of the semiconductor chips 51, 61, and 91 are in proximity to the burrs 42, wire bonding is facilitated and wire-bonding connection reliability improves.

Figure 16:
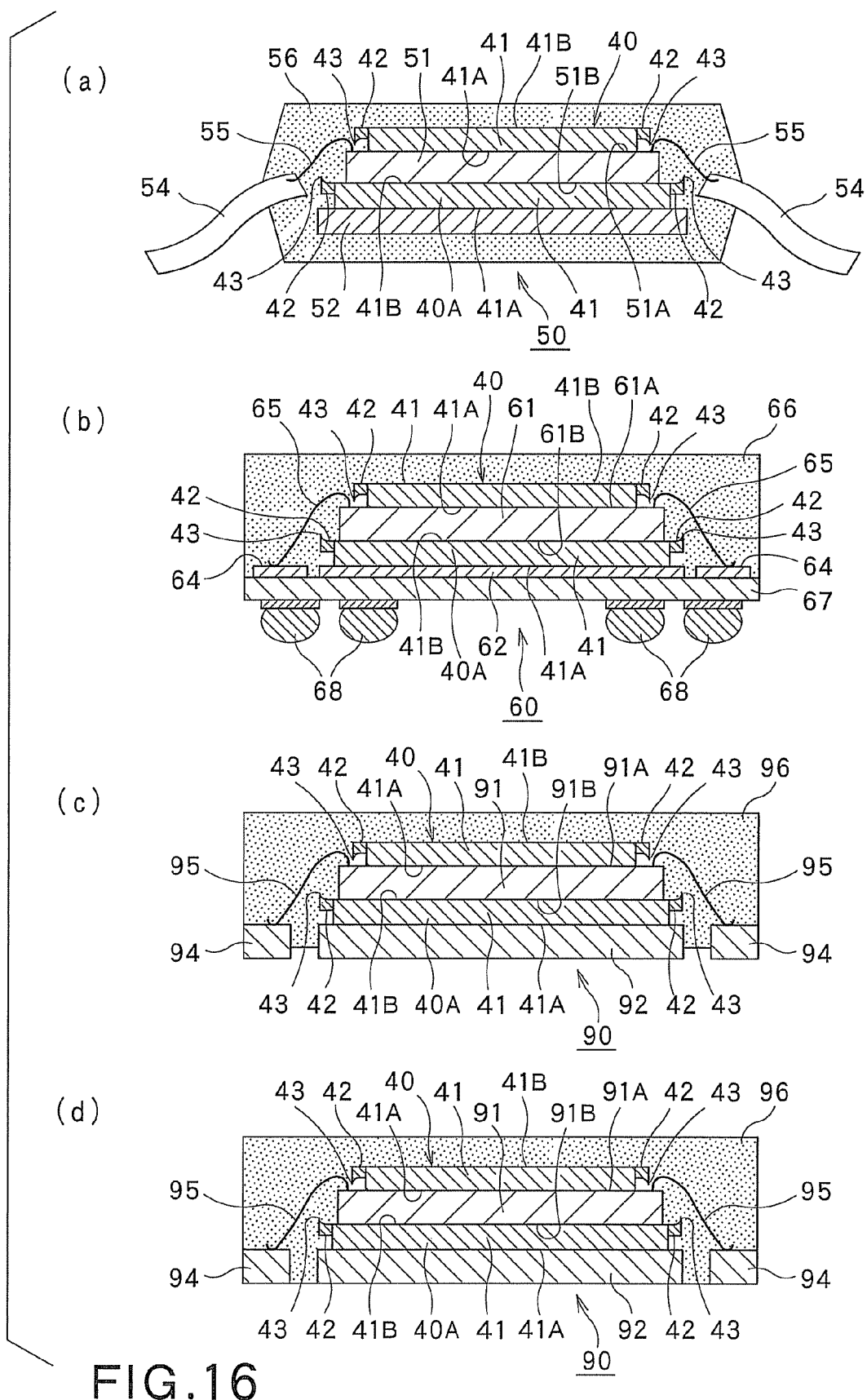
FIGS. 16(a) to 16(d) are schematic diagrams that illustrate further, different variations of the semiconductor device shown in FIGS. 8(a) to 8(d)

Referring to FIGS. 16(*a*) to 16(*d*), the first metallic shielding plate 40A is disposed with the first surface 41A directed towards the substrates 52, 62, and 92. The sharp burrs 43 on the first metallic shielding plate 40A extend e in a direction opposite to the substrates 52, 62, and 92, as shown in FIG. 4(*b*). The second metallic shielding plate 40 is disposed with the first surface 41A directed towards the semiconductor chips 51, 61, and 91. The sharp burrs 43 on the second metallic shielding plate 40 extend towards the semiconductor chips 51, 61, and 91, as shown in FIG. 4(*a*). In this case, the sharp burrs 43 do not extend above the second surface 41B of the metallic shielding plate 40 and thus the sealing resin 56, 66, and 96 formed above the metallic shielding plate 40 can be thinned down for reduced thickness of the entire semiconductor devices 50, 60, and 90. In addition, for a packaged structure having the package substrate 67 or die pad 92 resin-molded only on one surface thereof as shown in FIGS. 16(*b*) to 16(*d*), the extending of the sharp burrs 43 in the above direction improves adhesion of the sealing resin 66 and 96, hence becoming effective for preventing the sealing resin 66 and 96 from peeling off from the package substrate 67 or the die pad 92.

In FIGS. 8 to 16, the semiconductor chips 51, 61, and 91 is larger than the second metallic shielding plate 40, and the first metallic shielding plate 40A is larger than the semiconductor chips 51, 61, and 91. However, this does not limit the relationship in dimensional magnitude between the second metallic shielding plate 40, the semiconductor chips 51, 61, and 91, and the first metallic shielding plate 40A.

For example, the first metallic shielding plate 40A can be smaller than the semiconductor chips 51, 61, and 91. In this case, forming the semiconductor device into any one of the configurations shown in FIGS. 8 to 13 keeps the sharp burrs 43 of the first metallic shielding plate 40A free from contact with the semiconductor chips 51, 61, and 91, thus preventing the sharp burrs 43 from damaging the semiconductor chips 51, 61, and 91.

In order to obtain alternatively any one of the configurations shown in FIGS. 14 to 16, the first metallic shielding plate 40A is sized up relative to the semiconductor chips 51, 61, and 91. This prevents the sharp burrs 43 of the first metallic shielding plate 40A from coming into contact with the semiconductor chips 51, 61, and 91, and thus from damaging the semiconductor chips 51, 61, and 91.

Next, operation of the thus-configured present embodiment will be described.

(Method of Manufacturing the Metallic Shielding Sheet)

Figure 17:
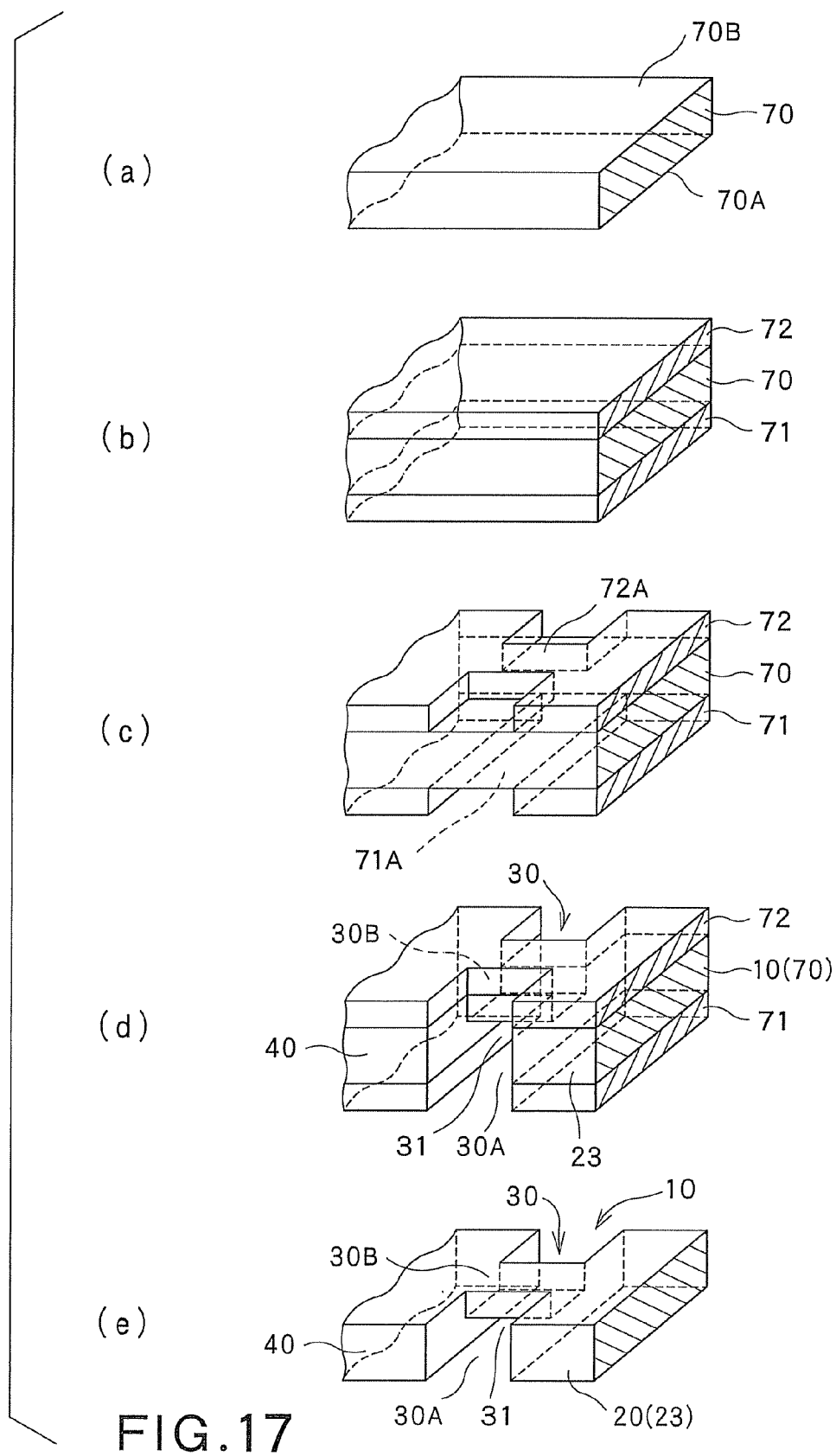
FIGS. 17(a) to 17(e) illustrate a method of manufacturing the metallic shielding sheet.
Figure 18:
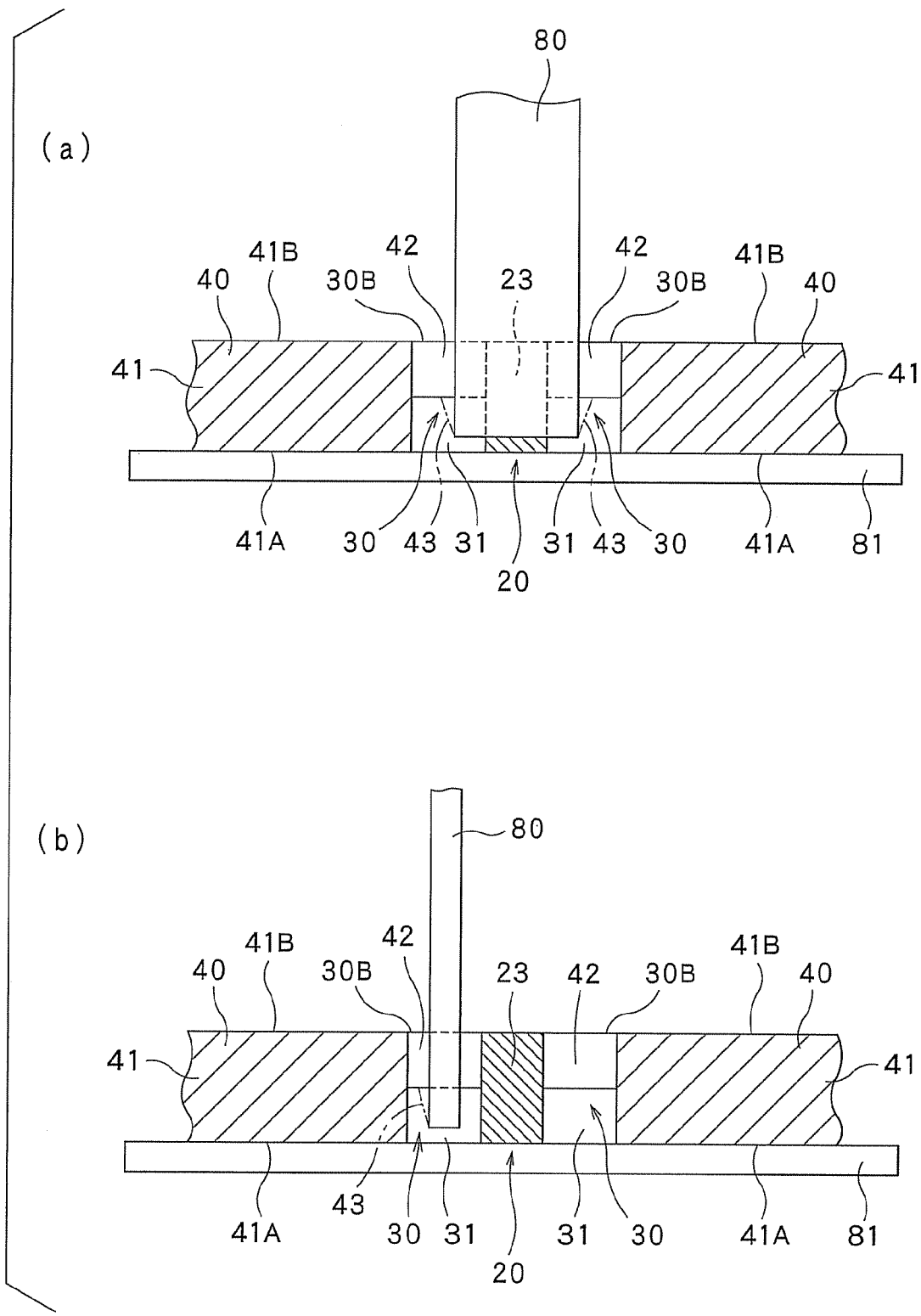
FIGS. 18(a) and 18(b) are sectional views illustrating the method of manufacturing the metallic shielding plate.
Figure 19:
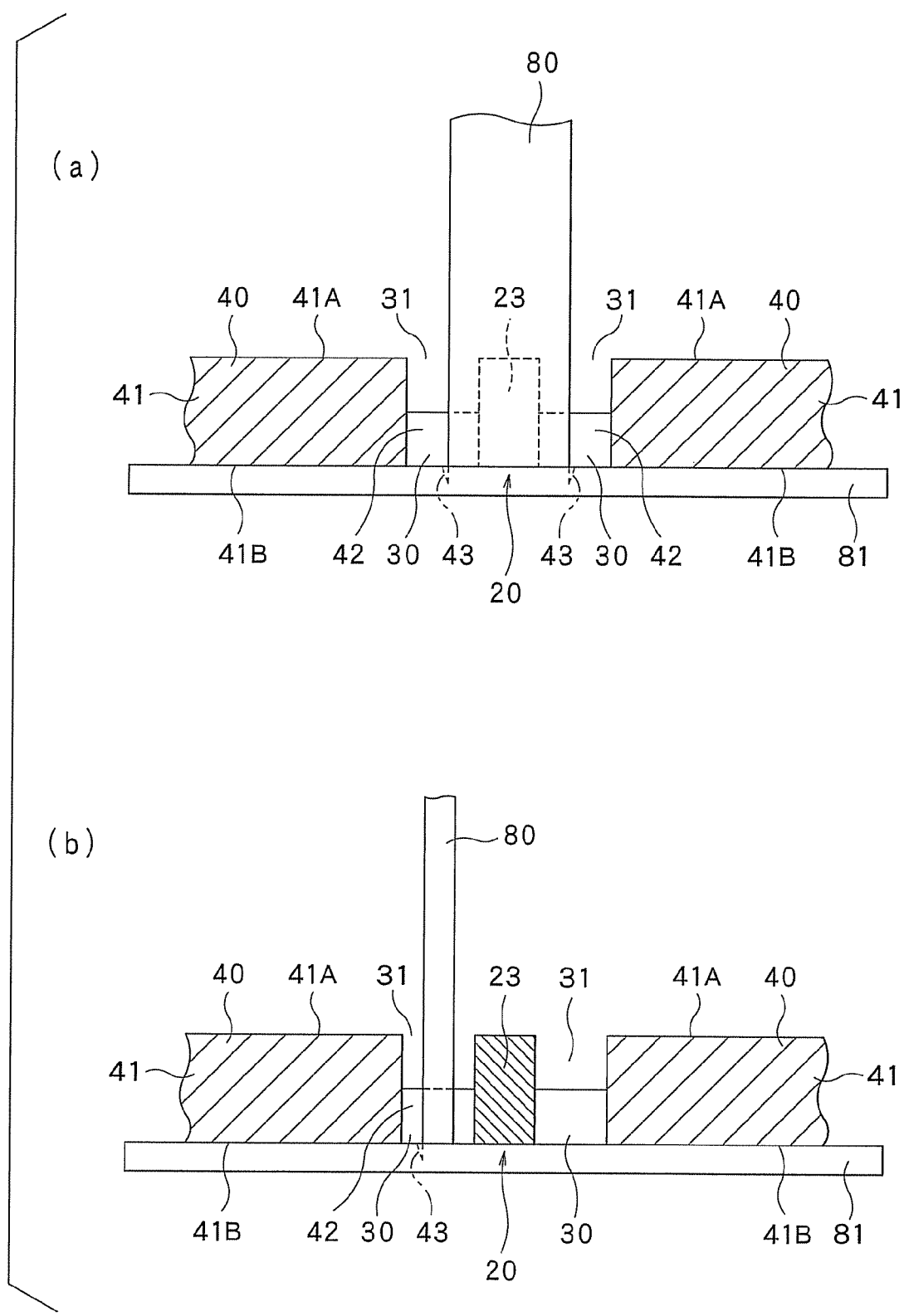
FIGS. 19(a) and 19(b) are other sectional views illustrating the method of manufacturing the metallic shielding plate.
Figure 20:
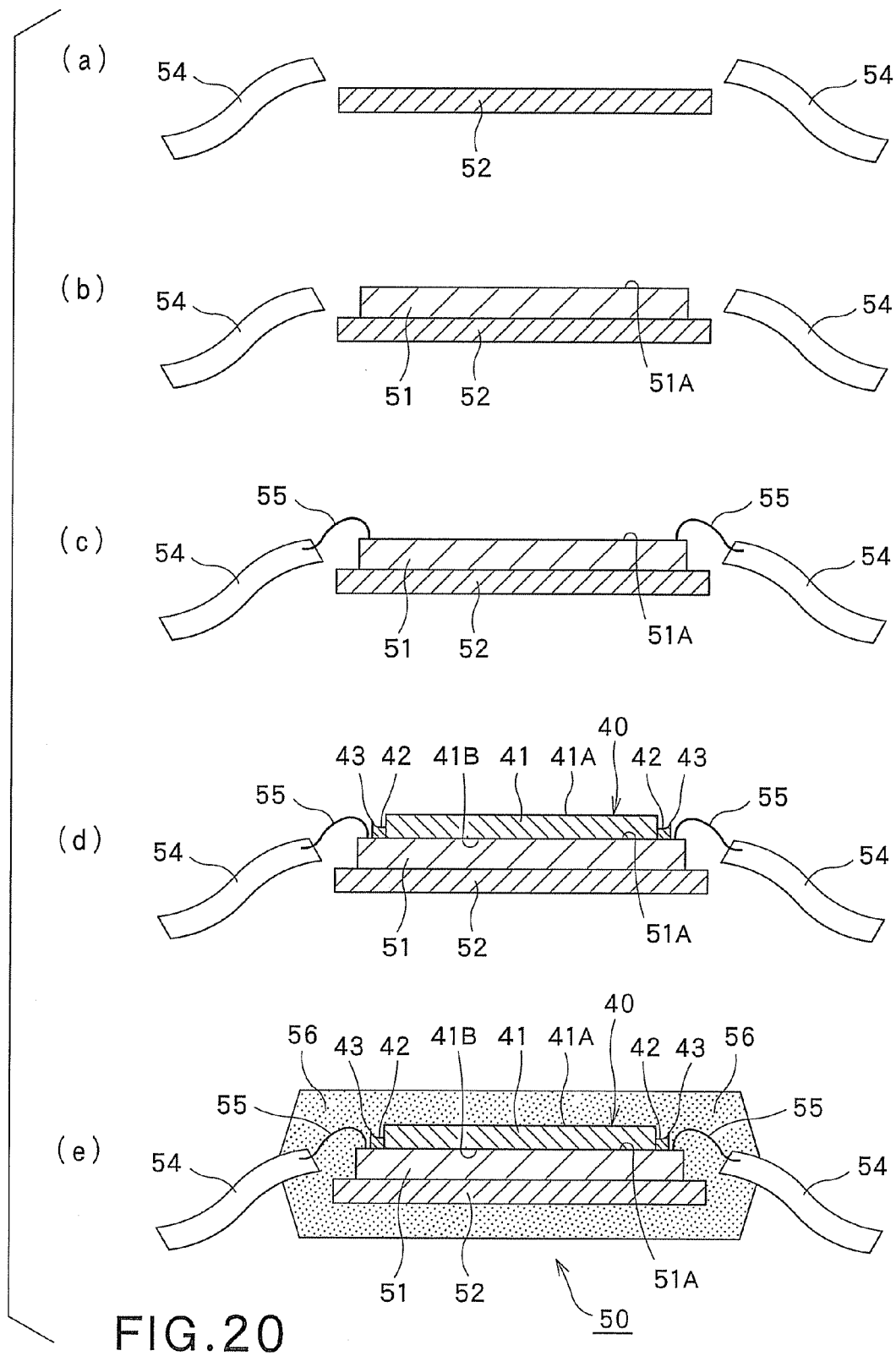
FIGS. 20(a) to 20(e) are schematic diagrams illustrating a method of manufacturing the semiconductor device according to the present invention.

A method of manufacturing the metallic shielding sheet including the metallic shielding plate for a semiconductor device is first described in accordance with FIGS. 17(*a*) to 17(*e*). FIGS. 17(*a*) to 17(*e*) illustrate a periphery of a connection 30 on the metallic shielding sheet 10 in enlarged view.

As shown in FIG. 17(*a*), a metallic substrate 70 for manufacturing the metallic shielding sheet 10 is set in place first. The metallic substrate 70, as described above, may preferably be formed from a metal of high magnetic permeability, containing an Fe—Ni alloy such as a permalloy PC material.

Next as shown in FIG. 17(b), a resist layer 71 is formed on an entire first surface 70A of the metallic substrate 70, and a resist layer 72 on an entire second surface 70B.

After that, a specific pattern of a predetermined shape is formed on the resist layers 71 and 72 each, as shown in FIG. 17(c). In this case, the predetermined patterns can be formed on the resist layers 71 and 72 by, for example, exposing the resist layers 71 and 72 to light via exposure masks, and after curing and then developing the resist layers 71 and 72, removing unnecessary portions from both layers 71 and 72.

More specifically, of the entire resist layer 71 provided on the first surface 70A of the metallic substrate 70, only a portion 71A corresponding to a connection 30 on the metallic shielding sheet 10 is removed to expose the metallic substrate 70. In contrast to this, of the entire resist layer 72 provided on the second surface 70B of the metallic substrate 70, only a portion 72A corresponding to the connection 30 is left unremoved.

Next, both surfaces 70A and 70B of the metallic substrate 70 are etched and portions of the metallic substrate 70 that do not include the resist layers 71 and 72 are removed, as shown in FIG. 17(d). The thus-removed portions of the metallic substrate 70 correspond primarily to the openings 21 in the frame body 20 of the metallic shielding sheet 10. The portions of the metallic substrate 70 that have not been removed correspond to the frame body 20 of the metallic shielding sheet 10, the connection 30, and the metallic shielding plate 40. The kinds of etchants useable for such etching include, for example, aqueous ferric chloride solutions, aqueous cupric chloride solutions, and alkaline aqueous solutions that contain cuprammonium complex ions.

During the etching of the metallic substrate 70, the portion corresponding to the connection 30 is half-etched from the first surface 70A of the metallic substrate 70 to the second surface 70B. The half-etching forms the connection 30 on the metallic shielding sheet 10 more thinly than the metallic shielding plate 40, thereby forming an etching space 31 extending from a first surface 30A, towards a second surface 30B.

The resist layers 71 and 72 are removed after that to obtain the above-described metallic shielding sheet 10, as shown in FIG. 17(e).

After this, the metallic shielding sheet 10 may be heat-treated at temperatures between 500° C. and 1,100° C., to further enhance the magnetic shielding effect of the metallic shielding sheet 10. Also, cleaning/washing/rinsing, inspection, and annealing steps may follow the removal of the resist layers 71 and 72 as appropriate.

(Methods of Manufacturing the Metallic Shielding Plate and the Semiconductor Device)

A method of manufacturing the metallic shielding plate from the metallic shielding sheet, and a method of manufacturing the semiconductor device will be next described using FIGS. 17 to 20.

First, the metallic shielding sheet 10 shown in FIG. 1 is fabricated through the above-described steps, as shown in FIGS. 17(a) to 17(e). Next, the thus-fabricated metallic shielding sheet 10 is carried to an assembly process site for the semiconductor devices 50, 60, and 90.

In the assembly process for the semiconductor devices 50, 60, and 90, the metallic shielding sheet 10 is first mounted on a fixing tape 81 for sawing and then fixed, as shown in FIG. 18(a). FIG. 18(a) is a sectional view of a periphery of connections 30 on the metallic shielding sheet 10.

Next, a blade 80 made of a diamond grindstone or the like is used to cut the connections 30 at the second surface 30B. Thus, the metallic shielding plate 40 is separated from the frame body 20 (this operation is called a sawing step). In this way, the metallic shielding plate 40 can be manufactured from the metallic shielding sheet 10, as shown in FIG. 4(a).

By the time that the sawing occurs, the etching space 31 extending from the first surface 30A, towards the second surface 30B, has already been formed, so a cutting load upon the blade 80 during the cutting of the connections 30 can be reduced nearly by half.

In the step of separating the metallic shielding plate 40 from the frame body 20, the connections 30 may each be cut using the blade 80, as shown in FIG. 18(b). Preferably, however, the connections 30 and a corresponding stay 23 may, as shown in FIG. 18(a), be integrally cut using a blade wider than the stay 23. More specifically, for improved working efficiency, the stay 23 and the connections 30, 30 that are positioned at both sides thereof may preferably be continuously cut together by moving the blade 80 longitudinally along the stay 23 (see line segment L in FIG. 1).

If, as shown in FIGS. 18(a) and 18(b), the blade 80 is used to cut connection(s) 30 at the second surface 41B of the shielding plate body 41, sharp burrs 43 are formed so as to extend towards the first surface 41A of the shielding plate body 41, as shown in FIG. 4(a).

Alternatively as shown in FIGS. 19(a) and 19(b), the connection(s) 30 may be cut at the first surface 41A of the shielding plate body 41 using the blade 80. In this case, sharp burrs 43 are formed so as to extend towards the second surface 41B of the shielding plate body 41, as shown in FIG. 4(b).

After that, the thus-manufactured metallic shielding plate 40 is used to manufacture the semiconductor devices 50, 60, and 90 in the assembly process.

A semiconductor device manufacturing method is described below taking the SOP-type semiconductor device 50 of FIG. 5(a) as an example. The other semiconductor devices 50, 60, and 90 shown in FIGS. 5(b) and 5(c), and FIGS. 6 to 16, can also be manufactured using substantially the same method as that described below.

First, a die pad 52 and lead frames 54 are set in place as shown in FIG. 20(a). Next, a semiconductor chip 51 is fastened to and mounted on an upper surface of the die pad 52 via a double-sided adhesive tape or a die-bonding material such as silver (Ag) paste, as shown in FIG. 20(b). After this, a circuit surface 51A of the semiconductor chip 51 and the lead frames 54 are electrically interconnected using bonding wires 55 made of gold, as shown in FIG. 20(c).

Next, the metallic shielding plate 40 is mounted on the semiconductor chip 51 and fixed, as shown in FIG. 20(d). The metallic shielding plate 40 used in this case has sharp burrs 43 extending towards the first surface 41A, as shown in FIG. 4(a). Additionally, the metallic shielding plate 40 is mounted on the semiconductor chip 51 so that the second surface 41B of the shielding plate body 41 faces the circuit surface 51A of the semiconductor chip 51. This results in the sharp burrs 43 extending in a direction opposite to the semiconductor chip 51. This, in turn, keeps the sharp burrs 43 free from contact with the semiconductor chip 51, thus preventing the sharp burrs 43 from damaging the circuit surface 51A of the semiconductor chip 51.

After that, the die pad 52, the semiconductor chip 51, the metallic shielding plate 40, and the bonding wires 55 are sealed with a sealing resin 56, whereby the semiconductor device 50 shown in FIG. 5(a) is obtained. This state is shown in FIG. 20(e).

For the above reasons, according to the present embodiment, when the metallic shielding plate 40 (including the first metallic shielding plate 40A and the second metallic shielding plate 40) is mounted in the semiconductor devices 50, 60, and 90, the sharp burrs 43 are kept out of contact with the semiconductor chips 51, 61, and 91 and the substrates 52, 62, and 92. This prevents the sharp burrs 43 from damaging the semiconductor chips 51, 61, and 91 and the substrates 52, 62, and 92.

Additionally, according to the present embodiment, the metallic shielding plate 40 is separated from the frame body 20 by the blade 80, in the assembly process for the semiconductor devices 50, 60, and 90. The separation eliminates the need, as in conventional technology, to manually mount the metallic shielding plate 40 on a special tray before manufacturing the semiconductor devices 50, 60, and 90. This, in addition to making the special tray unnecessary, reduces a working time and manufacturing costs.

Figure 21:
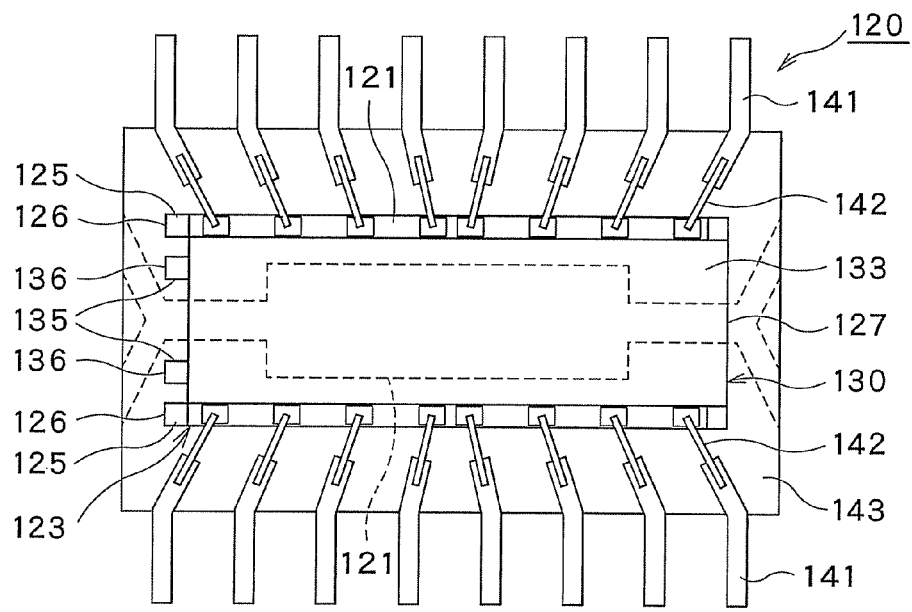
FIG. 21 is a plan view illustrating a variation of the semiconductor device according to the present invention.
Figure 22:
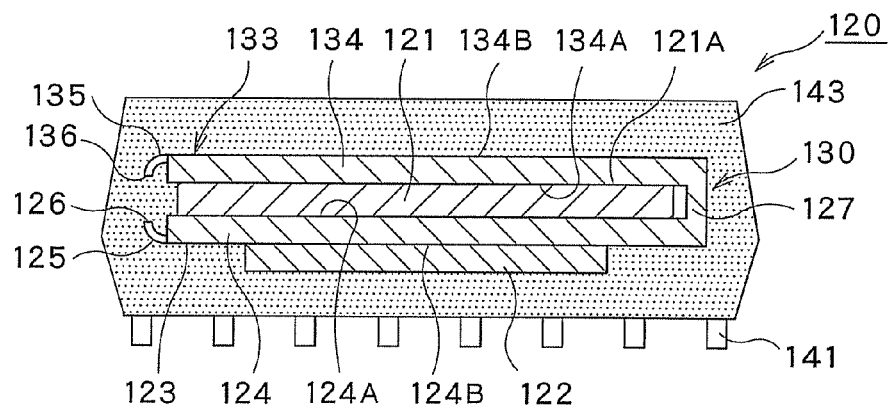
FIG. 22 is a longitudinal, sectional view illustrating the variation of the semiconductor device according to the present invention.
Figure 23:
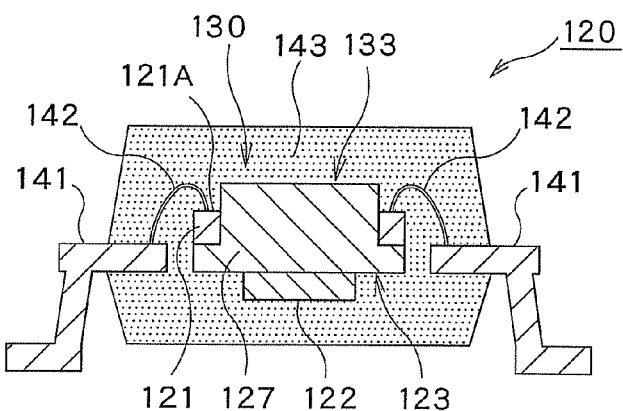
FIG. 23 is a lateral, sectional view illustrating the variation of the semiconductor device according to the present invention.

Next, variations of the semiconductor device according to the present embodiment are described below using FIGS. 21 to 23. FIGS. 21 to 23 are illustrative views of the variations of the semiconductor device.

Referring to FIGS. 21 to 23, the semiconductor device 120 includes a substrate (die pad) 122, a first metallic shielding plate 123 provided on the substrate 122, and a semiconductor chip 121 provided on the first metallic shielding plate 123 and having a circuit surface 121A. A second metallic shielding plate 133 is provided on the circuit surface 121A of the semiconductor chip 121.

The first metallic shielding plate 123 has a shielding plate body 124 including a first surface 124A and a second surface 124B, and burrs 125 protruding sideward from the shielding plate body 124. The first metallic shielding plate 123 is disposed with the second surface 124B directed towards the substrate 122, and the burrs 125 are each positioned contiguous to the second surface 124B of the shielding plate body 124. Also, at distal ends of the burrs 125, sharp burrs 126 are formed in a direction orthogonal to the second surface 124B, and the sharp burrs 126 extend in a direction opposite to the substrate 122.

The second metallic shielding plate 133 has a shielding plate body 134 including a first surface 134A and a second surface 134B, and burrs 135 protruding sideward from the shielding plate body 134. The second metallic shielding plate 133 is disposed with the first surface 134A directed towards the semiconductor chip 121, and the burrs 135 are each positioned contiguous to the second surface 134B of the shielding plate body 134. Also, at distal ends of the burrs 135, sharp burrs 136 are formed in a direction orthogonal to the second surface 134B, and the sharp burrs 136 extend towards the semiconductor chip 121.

In addition, the circuit surface 121A and lead frames (leads) 141 of the semiconductor chip 121 are electrically interconnected via bonding wires 142 made of gold. Furthermore, the substrate 122, the semiconductor chip 121, the first metallic shielding plate 123, the second metallic shielding plate 133, and the bonding wires 142 are sealed with a sealing resin 143.

Referring to FIGS. 21 to 23, the first metallic shielding plate 123 and the second metallic shielding plate 133 are integrally connected to each other via respective lateral edges 127, constituting a shielding member 130 of a transverse, nearly U-shaped form. In this case, the shielding member 130 of the transverse, nearly U-shaped form effectively absorbs magnetic fields applied from both perpendicular and horizontal directions.

As shown in FIG. 21, the first metallic shielding plate 123 is structurally larger than the second metallic shielding plate 133. Also, structurally the second metallic shielding plate 133 is, in a cross direction (top/bottom direction of FIG. 21), smaller than the semiconductor chip 121, and in a longitudinal direction (transverse direction of FIG. 21), slightly larger than the semiconductor chip 121. Additionally, height of the lateral edges 127 (i.e., a size of the edges 127 in the top/bottom direction of FIG. 22) is essentially equal to thickness of the semiconductor chip 121.

A planar substrate (not shown) that includes a first metallic shielding plate 123, lateral edges 127, and a second metallic shielding plate 133, is first provided for the fabrication of the above-described shielding member 130. This planar substrate contains a metal of high magnetic permeability, for example, an Fe—Ni alloy such as a permalloy PC material. Next bending the planar substrate into the transverse, nearly U-shaped form, allows the fabrication of the shielding member 130 shown in FIGS. 21 to 23. For ease of bending, the planar substrate is preferably half-etched beforehand to form an independent bending path between the first metallic shielding plate 123 and the lateral edges 127 and between the lateral edges 127 and the second metallic shielding plate 133.

(Second Embodiment)

Hereunder, a second embodiment of the present invention will be described with reference made to the accompanying drawings. FIGS. 24 to 33 illustrate the second embodiment of the present invention.

(Semiconductor Device Configurations)

Figure 24:
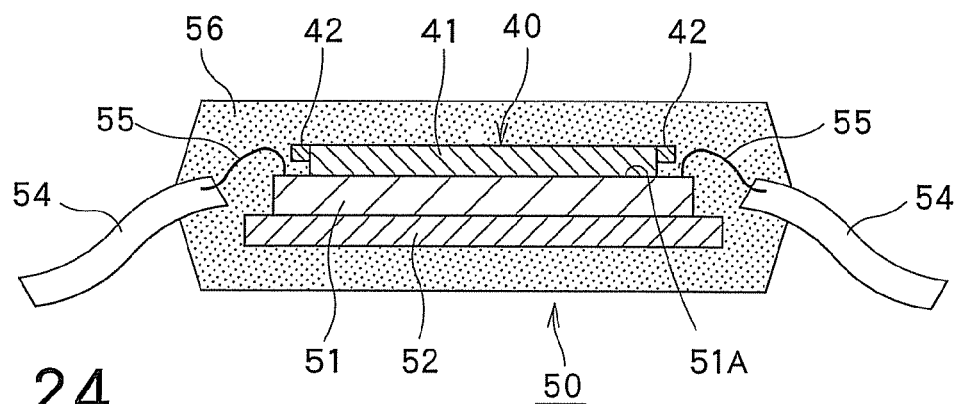
FIG. 24 is a schematic sectional view that illustrates an example of a semiconductor device (SOP) having a metallic shielding plate in a second embodiment.
Figure 25:
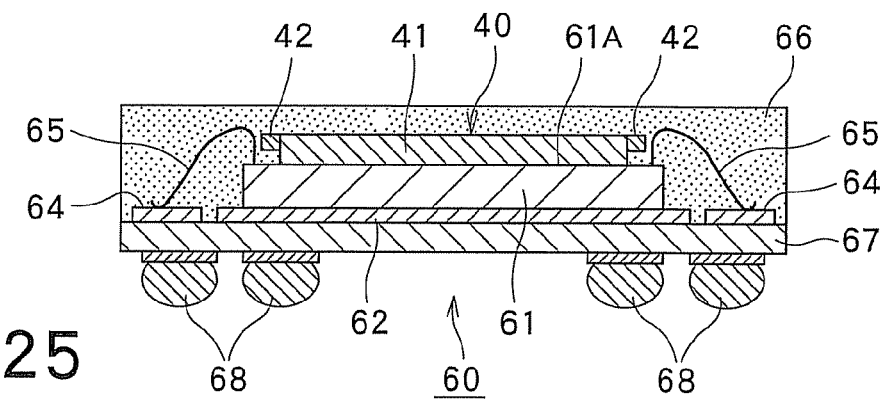
FIG. 25 is a schematic sectional view that illustrates another example of a semiconductor device (BGA) having a metallic shielding plate in the second embodiment.
Figure 26:
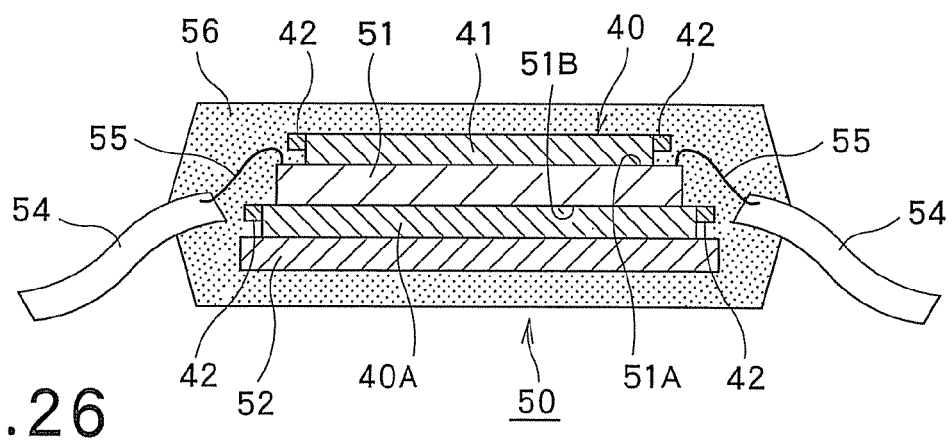
FIG. 26 is a schematic sectional view that illustrates yet another example of a semiconductor device (SOP) having a metallic shielding plate in the second embodiment.
Figure 27:
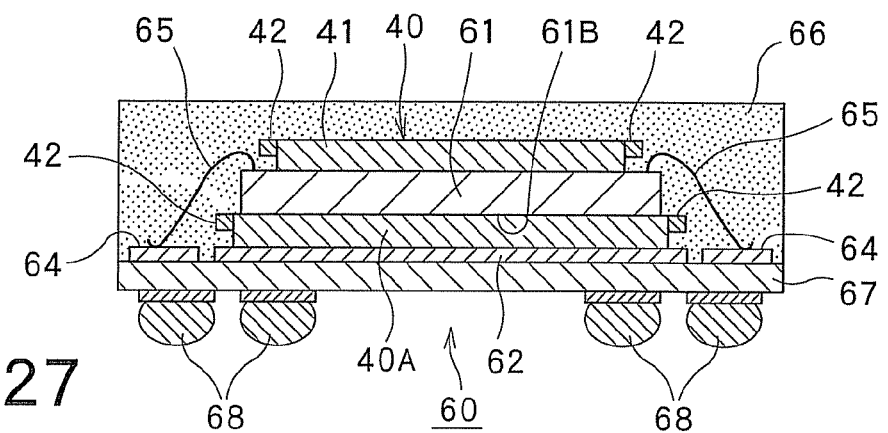
FIG. 27 is a schematic sectional view that illustrates a further example of a semiconductor device (BGA) having a metallic shielding plate in the second embodiment.

First, semiconductor devices with a metallic shielding plate are outlined below in accordance with FIGS. 24 to 27. FIGS. 24 and 26 illustrate semiconductor devices formed as SOPs (short for Small Outline Packages), and FIGS. 25 and 27 illustrate semiconductor devices formed as BGAs (short for Ball GridArray Packages).

The SOP type of semiconductor device shown in FIG. 24 includes a die pad 52, a semiconductor chip 51 mounted on the die pad 52 and having a circuit surface 51A, and a metallic shielding plate 40 provided on the circuit surface 51A of the semiconductor chip 51. The semiconductor chip 51 includes a semiconductor memory such as an MRAM, inclusive of a storage element that exhibits a magnetoresistive effect.

The metallic shielding plate 40, as will be described later herein, has a shielding plate body 41 and burrs 42 protruding sideward from the shielding plate body 41.

Also, the circuit surface 51A, and lead frames 54, of the semiconductor chip 51 are electrically interconnected via bonding wires 55 made of gold. Additionally, the die pad 52, the semiconductor chip 51, the metallic shielding plate 40, and the bonding wires 55 are sealed with a sealing resin 56.

Meanwhile, the BGA type of semiconductor device 60 shown in FIG. 25 includes a package substrate 67, a die pad 62 provided on the package substrate 67, a semiconductor chip 61 mounted on the die pad 62 and having a circuit surface 61A, and a metallic shielding plate 40 provided on the circuit surface 61A of the semiconductor chip 61. The semiconductor chip 61, as with the above-described semiconductor chip 51, includes a semiconductor memory such as an MRAM, inclusive of a storage element that exhibits a magnetoresistive effect.

The metallic shielding plate 40, as will be described later herein, has a shielding plate body 41 and burrs 42 protruding sideward from the shielding plate body 41.

Also, terminals 64 are provided on the package substrate 67, with solder balls 68 being electrically connected to the terminals 64. The solder balls 68 each protrude outward from the package substrate 67. Additionally, the terminals 64 and the circuit surface 61A of the semiconductor chip 61 are electrically interconnected via bonding wires 65 made of gold. Furthermore, the die pad 62, the semiconductor chip 61, the metallic shielding plate 40, the terminals 64, and the bonding wires 65 are sealed with a sealing resin 66.

Referring to FIGS. 24 and 25, the metallic shielding plate 40 is provided on the circuit surfaces 51A and 61A of the semiconductor chips 51 and 61. However, this does not limit the configuration of the semiconductor device; as shown in FIGS. 26 and 27, the semiconductor device may include, in addition to the metallic shielding plate 40 (in this case, as a second metallic shielding plate), a first metallic shielding plate 40A provided on surfaces 51B and 61B opposite to the circuit surfaces 51A and 61A of the semiconductor chips 51 and 61.

The semiconductor devices 50 and 60 shown in FIGS. 26 and 27, respectively, differ from those of FIGS. 24 and 25, only in that the metallic shielding plate 40A is added, and all other configurational factors are the same as shown in FIGS. 24 and 25. In FIGS. 26 and 27, the same sections as those of the embodiment shown in FIGS. 24 and 25 are each assigned the same reference number. In addition, a configuration of the added metallic shielding plate 40A shown in FIGS. 26 and 27 is the same as of the metallic shielding plate 40 described above.

More specifically, as shown in FIG. 26, the SOP type of semiconductor device 50 has the added metallic shielding plate 40A on the opposite surface 51B of the semiconductor chip 51 with respect to the circuit surface 51A thereof. In this case, the added metallic shielding plate 40A is interposed between the semiconductor chip 51 and the die pad 52.

Meanwhile, as shown in FIG. 27, the BGA type of semiconductor device 60 has the added metallic shielding plate 40A on the opposite surface 61B of the semiconductor chip 61 relative to the circuit surface 61A thereof. In this case, the added metallic shielding plate 40A is interposed between the semiconductor chip 61 and the die pad 62.

(Configuration of the Metallic Shielding Plate)

Next, the metallic shielding plate fabricated using a metallic shielding plate manufacturing method according to the present invention is outlined below using FIG. 28.

Figure 28:
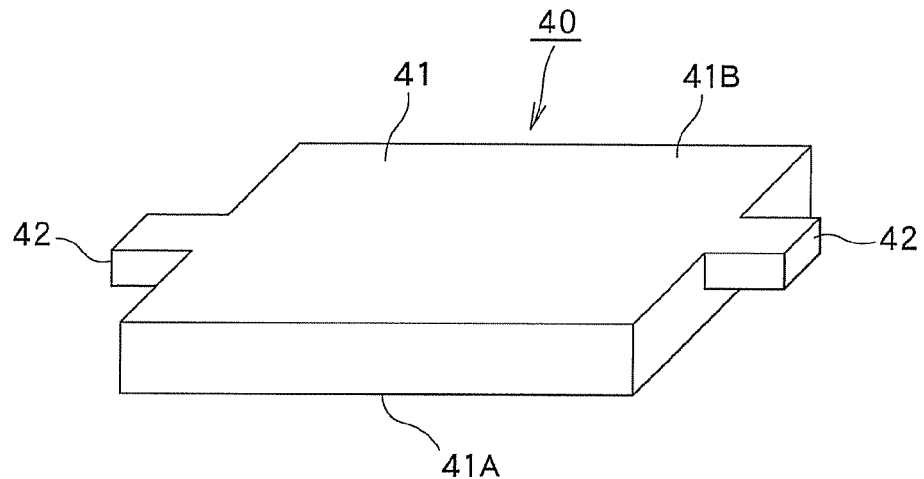
FIG. 28 is a perspective view of the metallic shielding plate.

The metallic shielding plate 40 for semiconductor devices, shown in FIG. 28, is included in the semiconductor devices 50 and 60, as described above.

The thus-constructed metallic shielding plate 40 has a rectangular shielding plate body 41 and burrs protruding sideward from the shielding plate body 41. More specifically, the burrs are residues 42 that are left after connections 30 have been cut.

The burrs 42 are each positioned contiguous to a second surface 41B of the shielding plate body 41. Each burr 42 is thinner than the shielding plate body 41. The burr 42 is equivalent to a part of one connection 30 on a worked permalloy PC material 10, which will be described later herein.

The metallic shielding plate 40 is formed from a permalloy PC material, that is, a soft, magnetic, metallic material that contains molybdenum, copper, and/or other elements added to an Fe—Ni alloy with a 70% to 85% nickel content.

The metallic shielding plate 40 is dimensionally not defined. Thickness of the metallic shielding plate 40, however, may preferably be between 50 µm and 200 µm, and further preferably between 100 µm and 150 µm. If the thickness of the metallic shielding plate 40 is less than 50 µm, this thickness is insufficient for protecting the semiconductor chip from external magnetism. Conversely if the thickness of the metallic shielding plate 40 exceeds 200 µm, this is not preferable, because the entire semiconductor devices 50 and 60 will be too thick.

(Configuration of the Worked Permalloy PC material as the Metallic Shielding Sheet)

Next, the worked permalloy PC material (metallic shielding sheet) used in the metallic shielding plate manufacturing method according to the present invention is outlined below using FIG. 29.

Figure 29:
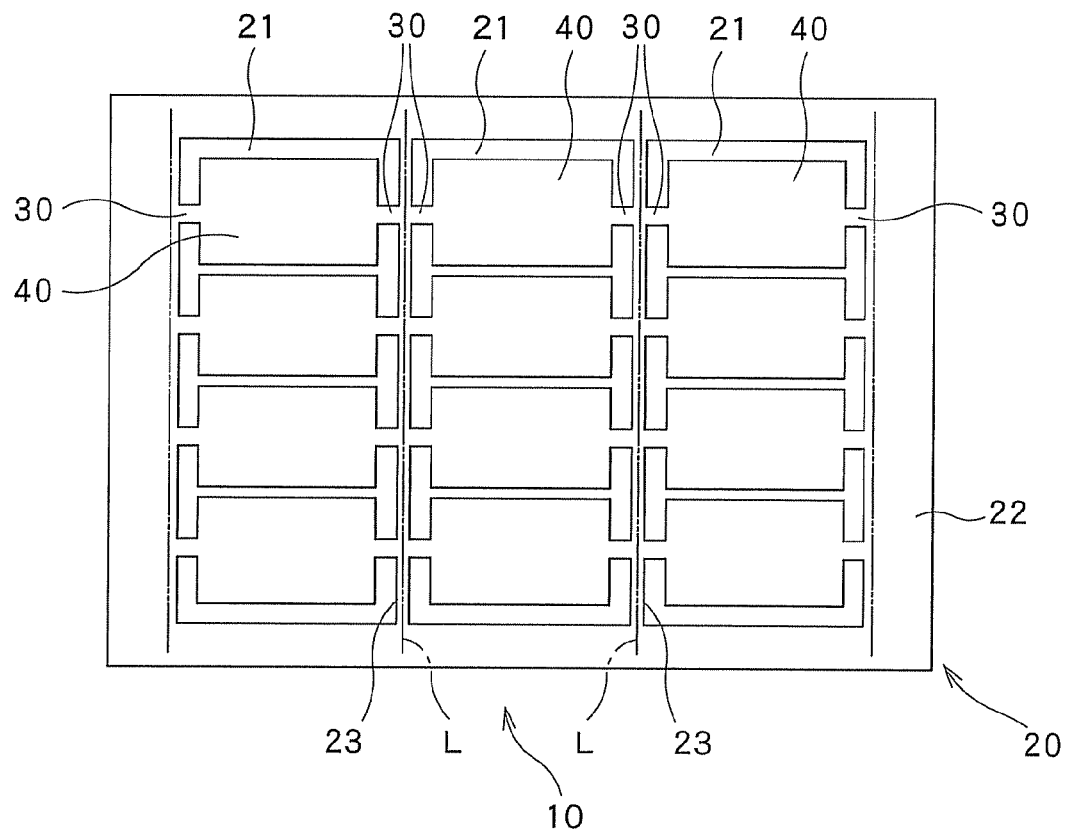
FIG. 29 is a plan view of a worked permalloy PC material.
Figure 30:
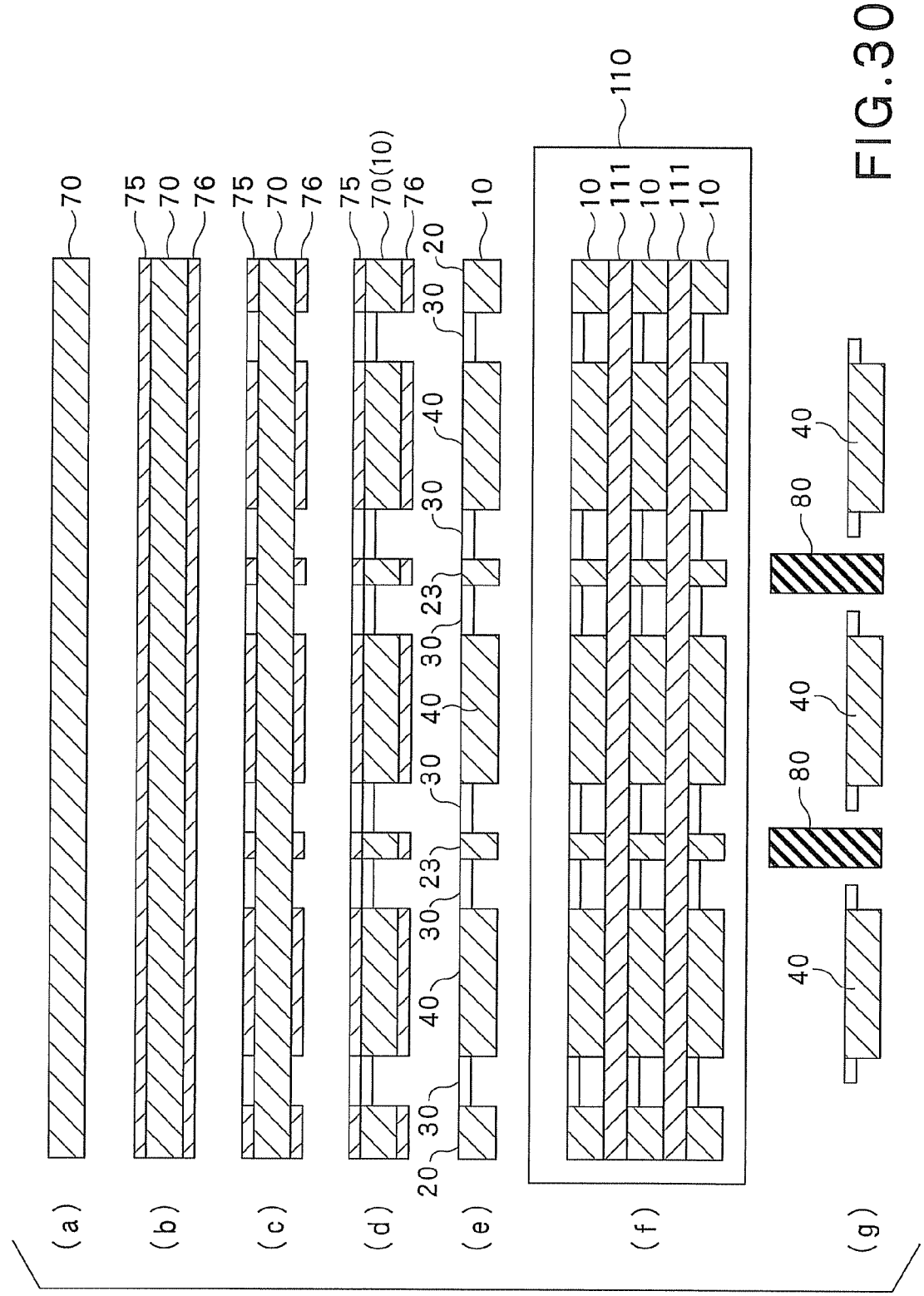
FIGS. 30(a) to 30(g) illustrate a method of manufacturing the metallic shielding plate according to the second embodiment of the present invention.

As shown in FIG. 29, the worked permalloy PC material 10 includes a frame body 20 having a plurality of rectangular openings 21, and a plurality of metallic shielding plates 40 arranged in the openings 21 of the frame body 20 and connected to the frame body 20 via connecting portions 30.

The frame body 20 includes an outer frame 22 that surrounds the plurality of entire openings 21, and a plurality of elongated stays 23 formed between mutually adjacent openings 21 and arranged in parallel to one another. The outer frame 22 and stays 23 of the frame body 20, and the metallic shielding plates 40 are the same in thickness between one another.

As shown in FIG. 29, the connecting portions (hereinafter, referred to as connections) 30 are provided on lateral edges of each metallic shielding plate 40. That is to say, each connection 30 interconnects the corresponding lateral edge of the metallic shielding plate 40 and the corresponding stay 23 (or outer frame 22) of the frame body 20. The connection 30 is preferably formed more thinly than the metallic shielding plate 40 by half-etching.

Also, the metallic shielding plate 40 is fabricated by cutting the worked permalloy PC material 10 at connections 30 and separating the connections 30 from the frame body 20. The configuration of the metallic shielding plate 40 has already been described using FIG. 28, and further detailed description of the configuration is therefore omitted here.

The worked permalloy PC material 10, as will be detailed later herein, is fabricated by etching one sheet of metal (permalloy PC material 70). That is to say, the frame body 20, connection 30, and metallic shielding plate 40 of the worked permalloy PC material 10 are formed integrally with one another.

The worked permalloy PC material 10, as with the metallic shielding plate 40 described above, is formed from a permalloy PC material. Thickness of the worked permalloy PC material 10, as with that of the metallic shielding plate 40, is preferably between 50 µm and 200 µm, and further preferably between 100 µm and 150 µm.

(Method of Manufacturing the Metallic Shielding Plate)

A method of manufacturing the metallic shielding plate according to the present invention will be next described using FIGS. 30(a) to 30(g), 31, and 32.

First, an unworked permalloy PC material 70 of a flat-plate form for manufacturing a worked permalloy PC material 10 is set in place as shown in FIG. 30(a).

Next, as shown in FIG. 30(b), a resist layer 75 is formed on one surface of the permalloy PC material 70, and a resist layer 76 on another surface thereof.

After that, a specific pattern of a predetermined shape is formed on the resist layers 75 and 76 each, as shown in FIG. 30(c). In this case, the predetermined patterns can be formed on the resist layers 75 and 76 by, for example, exposing the resist layers 75 and 76 to light via exposure masks not shown, and after curing and then developing the resist layers 75 and 76, removing unnecessary portions from both layers 75 and 76.

Next, both surfaces of the permalloy PC material 70 are etched and portions of the permalloy PC material 70 that do not include the resist layers 75 and 76 are removed, as shown in FIG. 30(d). The thus-removed portions of the permalloy PC material 70 correspond primarily to the openings 21 in the frame body 20 of the worked permalloy PC material 10. The portions of the permalloy PC material 70 that have not been removed correspond to the frame body 20 of the worked permalloy PC material 10, the connections 30, and the metallic shielding plate 40. During the etching of the both surfaces of the permalloy PC material 70, the portion corresponding to the connection 30 is half-etched to form the connection 30 more thinly than the metallic shielding plate 40. The kinds of etchants useable for such etching include, for example, aqueous ferric chloride solutions, aqueous cupric chloride solutions, and alkaline aqueous solutions that contain cuprammonium complex ions.

The resist layers 75 and 76 are removed after that to obtain the above-described flat-plate-like worked permalloy PC material 10, as shown in FIG. 30(e). The worked permalloy PC material 10 includes the frame body 20, the connections 30, and the metallic shielding plate 40.

After this, the worked permalloy PC material 10 is heat-treated (annealed) at temperatures between 650° C. and 850° C., to further enhance the magnetic shielding effect of the worked permalloy PC material 10. The heat-treating process is described below.

Figure 31:
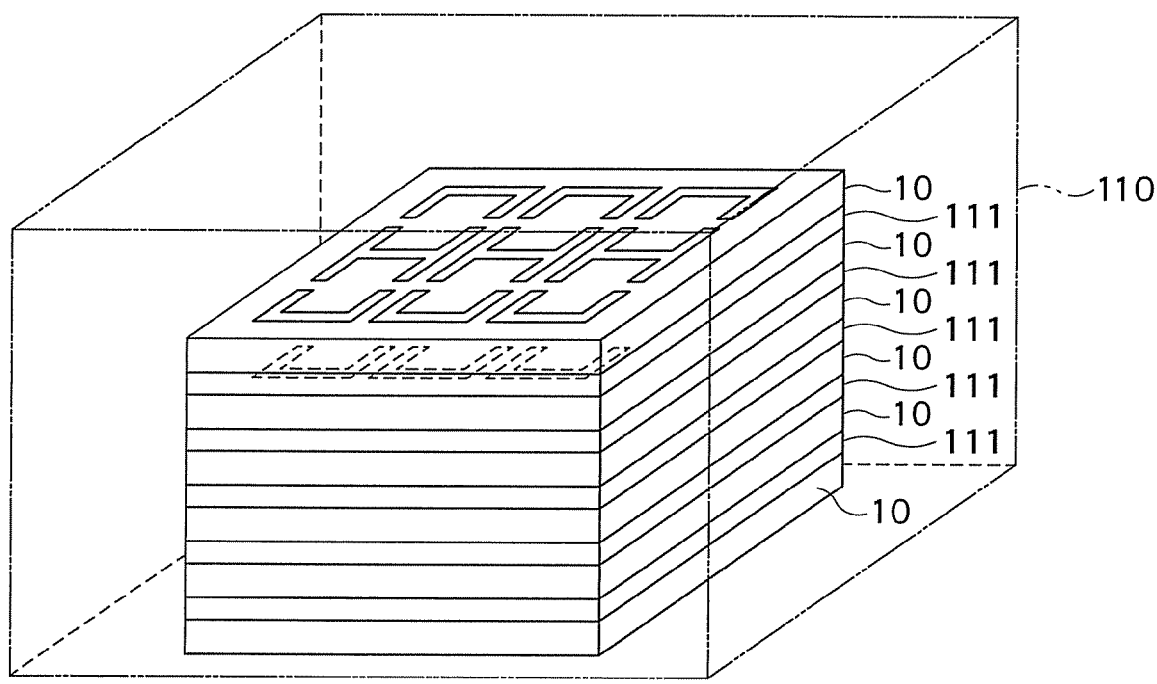
FIG. 31 is a schematic perspective view of the worked permalloy PC material disposed in a heat-treating furnace.

First, a plurality of flat-plate-like worked permalloy PC materials 10 are fabricated by repeating the steps described above using FIGS. 30(a) to 30(e). Next, as shown in FIGS. 30(f) and 31, the plurality of worked permalloy PC materials 10 are arranged in a mutually stacked manner and placed in a heat-treating furnace 110 including an electric furnace or the like.

During the above fabrication, the plurality of flat-plate-like worked permalloy PC materials 10 are stacked via opening-free flat spacers 111. In other words, the worked permalloy PC materials 10 and the spacers 111 are stacked at alternate positions as shown in FIGS. 30(f) and 31.

Each spacer 111 preferably has the same coefficient of linear expansion as the worked permalloy PC material 10 (permalloy PC material 70). Also, the spacer 111 is further preferably formed from a permalloy PC material. Use of these spacers reliably prevents the worked permalloy PC materials 10 from becoming softened and deformed, resultingly improving a conforming-product rate of metallic shielding plates 40.

Next, the heat-treating furnace 110 is enclosed and then charged with an inert gas such as a hydrogen gas. After this, the plurality of worked permalloy PC materials 10 are heat-treated at 650° C. to 850° C. in the inert gas atmosphere.

During the heat treatment, an internal temperature of the heat-treating furnace 110 is increased to a predetermined level (650° C. to 850° C.), under which state, the plurality of worked permalloy PC materials 10 are heated for about three to eight hours, for example.

After this, the worked permalloy PC materials 10 are gradually cooled in the heat-treating furnace 110 until a temperature of the permalloy PC materials 10 has decreased to normal temperature. This annealing operation accelerates recrystallization of the metal of each permalloy PC material 10. Worked permalloy PC materials 10 with an enhanced magnetic shielding effect can thus be obtained.

Figure 32:
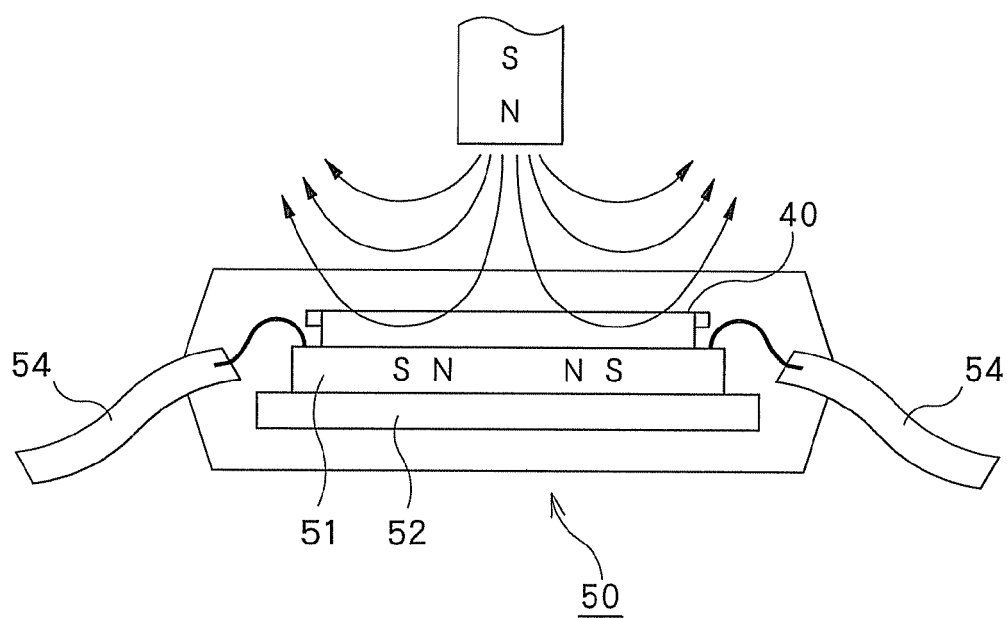
FIG. 32 is an illustrative diagram representing a relationship between magnetic permeability of the metallic shielding plate and a shielding effect thereof against external magnetic force.

At heat-treating temperatures below 650° C., magnetic permeability ($\mu i$) and coercivity (Hc) of the metallic shielding plate 40 become insufficient. In general, as shown in FIG. 32, as the permeability (relative permeability: $\mu i$) of the metallic shielding plate 40 increases, magnetic force from the outside will permeate more easily along the metallic shielding plate 40, thus enhancing the effect of shielding the semiconductor chip 51 from the external magnetic force. Also, in general, as the coercivity (Hc) of the metallic shielding plate 40 decreases, the effect of shielding the semiconductor chip 51 from the external magnetic force enhances. The permeability ($\mu i$) required here of the metallic shielding plate 40 for semiconductor devices 50 and 60 is at least 6,000, and the coercivity (Hc) required is up to 6.0 A/m. These permeability ($\mu i$) and coercivity (Hc) data requirements may not be satisfied if the heat-treating temperature of the worked permalloy PC material 10 decreases below 650° C.

Conversely if the heat-treating temperature exceeds 850° C., since this temperature becomes close to a temperature region in which the recrystallization of the metal of the permalloy PC material is accelerated, the worked permalloy PC materials 10 is liable to adhere to one another in the heat-treating furnace 110 or to become softened and get deformed.

The worked permalloy PC materials 10 that have thus been fabricated are next carried to the assembly process site for the semiconductor devices 50 and 60.

In the assembly process for the semiconductor devices 50 and 60, the worked permalloy PC material 10 is fixed and then the corresponding connections 30 are cut using a blade 80 made of a diamond grindstone or the like, as shown in FIG. 30(g). Thus, the metallic shielding plate 40 is separated from the frame body 20 (this operation is called a sawing step). In this way, individual metallic shielding plates 40 (see FIG. 28) are separated from the worked permalloy PC material 10.

In the step of separating the metallic shielding plate 40 from the frame body 20, the connections 30 may be cut at each stay 23 using the blade 80. Preferably, however, the connections 30 and the corresponding stay 23 are integrally cut using a blade 80 wider than the stay 23. More specifically, for improved separating efficiency, preferably the stay 23 and the connections 30, 30 that are positioned at both sides thereof are continuously cut together by moving the blade 80 longitudinally along the stay 23 (see line segment L in FIG. 29).

After the separating step, the thus-manufactured metallic shielding plate 40 is used to manufacture the above-described semiconductor devices 50 and 60 in the assembly process.

For the above reasons, according to the present embodiment, the worked permalloy PC materials 10 are heat-treated at 650° C. to 850° C. in the internal inert gas atmosphere of the heat-treating furnace 110. This heat treatment prevents the internal temperature of the heat-treating furnace 110 from reaching the temperature region in which the recrystallization of the metal of the permalloy PC material is accelerated, and hence the worked permalloy PC materials 10 from adhering to one another in the heat-treating furnace 110. There is no need, therefore, to interpose alumina powder between the worked permalloy PC materials 10 during the heat treatment. This, in turn, allows efficient fabrication of the metallic shielding plate 40 while ensuring the characteristics (magnetic permeability and coercivity) required of the metallic shielding plate 40. In other words, prior setup expenses for the heat treatment are reduced and no need arises to clean/wash/rinse for removal of alumina powder after the heat treatment. In addition, since the worked permalloy PC materials 10 are kept free from softening and deformation in the heat-treating furnace 110, metallic shielding plates 40 can be obtained at a high conforming-product rate.

Furthermore, according to the present embodiment, the plurality of flat-plate-like worked permalloy PC materials 10 are stacked via spacers 111, which have the same coefficient of linear expansion as the worked permalloy PC materials 10 (permalloy PC material 70). For these reasons, the worked permalloy PC materials 10 are prevented from becoming softened and deformed, and a conforming-product rate of each metallic shielding plate 40 improves as a result.

Alternatively, it is possible to directly stack the plurality of flat-plate-like worked permalloy PC materials 10 upon one another without interposing the spacers 111. In that case, in order to prevent the worked permalloy PC materials 10 from deforming, positions of the upper and lower worked permalloy PC materials 10 (e.g., positions of the openings 21) are preferably matched accurately.

Moreover, although the worked permalloy PC materials 10 in the present embodiment are fabricated by etching the permalloy PC material 70, the fabrication is not limited to the etching method and the worked permalloy PC materials 10 can likewise be fabricated by pressing the permalloy PC material 70.

EXAMPLE

The following describes a more specific example of implementing the present invention:

First, a flat-plate-like permalloy PC material 70 with a plate thickness "t" of 0.150 mm is set in place. Next, the permalloy PC material 70 is worked by etching. More specifically, after plate make-up using an original plate designed so that connections 30 are thinly formed by half-etching, a plurality of flat-plate-like worked permalloy PC materials 10 are fabricated that each include metallic shielding plates 40.

Next, the plurality of worked flat-plate-like permalloy PC materials 10 are arranged in stacked form in a heat-treating furnace (electric furnace) 110 and then heat-treated at 750° C. in an inert gas (hydrogen gas) atmosphere. Prior to the heat treatment, a spacer 111 is interposed between the flat-plate-like worked permalloy PC materials 10.

After thus being heated at 750° C. for four hours, the worked permalloy PC materials 10 are gradually cooled (annealed). The metallic shielding plates 40 are next separated from each worked permalloy PC material 10.

Figure 33:
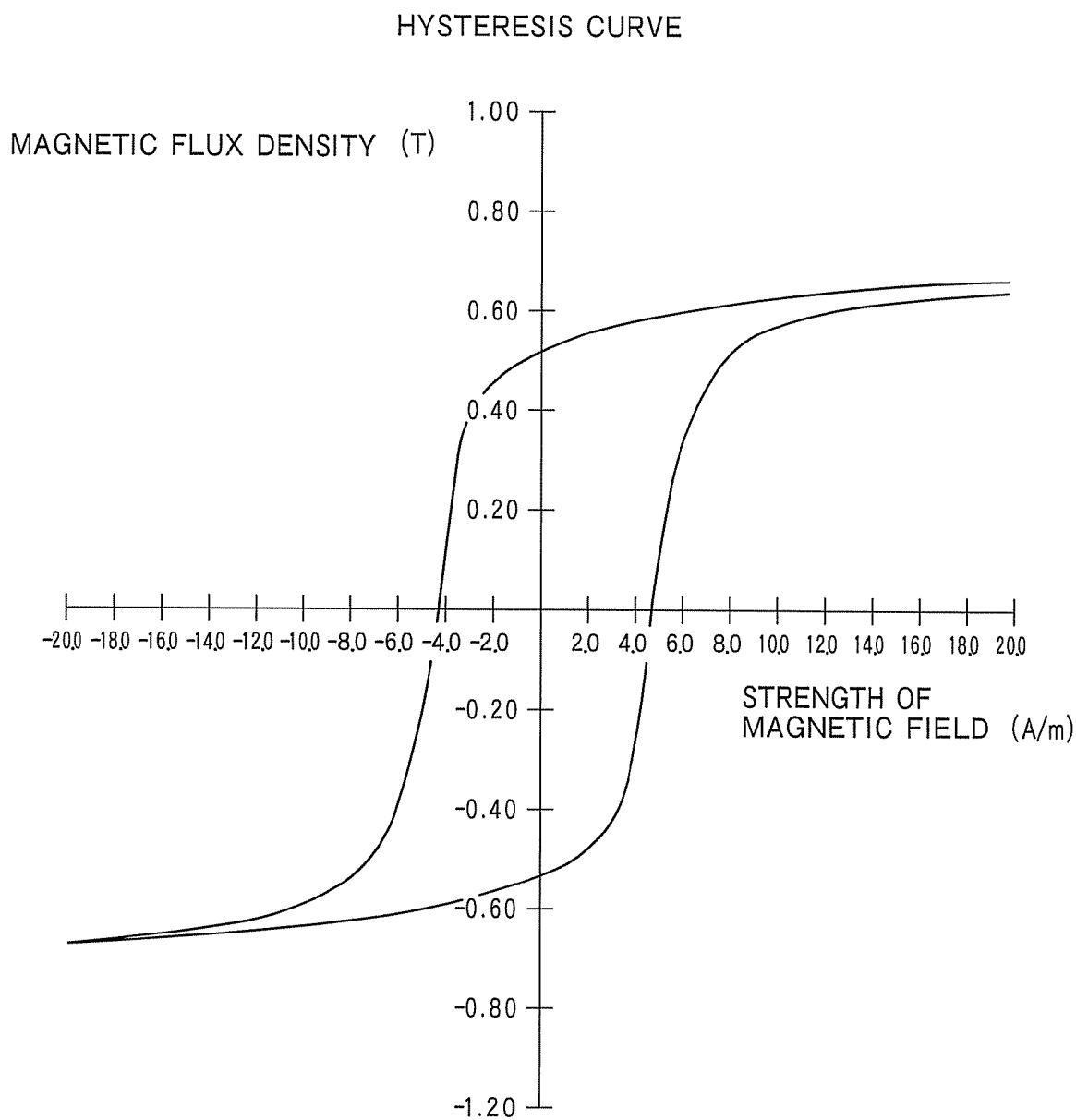
FIG. 33 is a diagram illustrating a hysteresis curve of the metallic shielding plate in an example of the present invention.

Next, a hysteresis curve that indicates variations in strength of a magnetic field applied from the outside to each metallic shielding plate 40 is created (see FIG. 33). The permeability ($\mu$i) and coercivity (Hc) of the metallic shielding plate 40 are measured as its characteristics data. A permeability ($\mu$i) of 21,900 and a coercivity (Hc) of 4.46 (A/m) are obtained as a result. These values sufficiently satisfy the characteristics data required of the metallic shielding plate 40 for MRAMs.

What is claimed is:

1. A semiconductor device comprising:
a semiconductor chip with a circuit surface; and
a metallic shielding plate provided at least on the circuit surface of the semiconductor chip;
wherein the metallic shielding plate has
a shielding plate body including a first surface and a second surface, and
burrs protruding sideward from the shielding plate body;
the metallic shielding plate is disposed in such a manner that the second surface of the shielding plate body is directed towards the circuit surface of the semiconductor chip;
the burrs are positioned contiguous to the second surface of the shielding plate body; and
at distal ends of the burrs, sharp burrs are formed in a direction orthogonal to the second surface, the sharp burrs extending in a direction opposite to the semiconductor chip.

2. The semiconductor device according to claim 1, wherein:
the metallic shielding plate is formed from a material containing an Fe-Ni alloy.

3. A semiconductor device comprising:
a semiconductor chip with a circuit surface; and
a metallic shielding plate provided at least on the circuit surface of the semiconductor chip;
wherein metallic shielding plate has
a shielding plate body including a first surface and a second surface, and
burrs protruding sideward from the shielding plate body;
the metallic shielding plate is disposed in such a manner that the first surface of the shielding plate body is directed towards the circuit surface of the semiconductor chip;
the burrs are positioned contiguous to the second surface of the shielding plate body; and
at distal ends of the burrs, sharp burrs are formed in a direction orthogonal to the second surface.

4. The semiconductor device according to claim 3, wherein:
the metallic shielding plate is formed from a material containing an Fe-Ni alloy.

5. A semiconductor device comprising:
a substrate;
a first metallic shielding plate provided on the substrate;
a semiconductor chip provided on the first metallic shielding plate and having a circuit surface thereon; and
a second metallic shielding plate provided on the circuit surface of the semiconductor chip;
wherein the first metallic shielding plate has
a shielding plate body including a first surface and a second surface, and
burrs protruding sideward from the shielding plate body;
the first metallic shielding plate is disposed in such a manner that the second surface of the shielding plate body is directed towards the substrate;
the burrs are positioned contiguous to the second surface of the shielding plate body; and
at distal ends of the burrs, sharp burrs are formed in a direction orthogonal to the second surface, the sharp burrs extending in a direction opposite to the substrate.

6. The semiconductor device according to claim 5, wherein:
the first metallic shielding plate and the second metallic shielding plate are each formed from a material containing an Fe-Ni alloy.

7. A semiconductor device comprising:
a substrate;
a first metallic shielding plate provided on the substrate;
a semiconductor chip provided on the first metallic shielding plate and having a circuit surface thereon; and
a second metallic shielding plate provided on the circuit surface of the semiconductor chip;
wherein the first metallic shielding plate has
a shielding plate body including a first surface and a second surface, and
burrs protruding sideward from the shielding plate body;
the first metallic shielding plate is disposed in such a manner that the first surface of the shielding plate body is directed towards the substrate;
the burrs are positioned contiguous to the second surface of the shielding plate body; and
at distal ends of the burrs, sharp burrs are formed in a direction orthogonal to the second surface.

8. The semiconductor device according to claim 7, wherein:
the first metallic shielding plate and the second metallic shielding plate are each formed from a material containing an Fe-Ni alloy.

9. A method of manufacturing a metallic shielding plate used in a semiconductor device inclusive of a semiconductor chip and of a resin for sealing the semiconductor chip, wherein the metallic shielding plate protects the semiconductor chip from external magnetism, the method comprising the steps of:

providing permalloy PC materials;

working each of the permalloy PC materials to form flat-plate-like, worked permalloy PC materials each including a frame body and at least one metallic shielding plate which is connected to the frame body via a connecting portion;

arranging the plurality of flat-plate-like, worked permalloy PC materials in a mutually stacked manner and placing the stacked materials in a heat-treating furnace;

subjecting the worked permalloy PC materials to heat treatment at 650° C. to 850° C. under an inert gas atmosphere in the heat-treating furnace; and separating the metallic shielding plate from the frame body of each of the worked permalloy PC materials by cutting the connecting portion.

10. The method of claim 9, wherein:
the plurality of flat-plate-like, worked permalloy PC materials are each stacked via a spacer, the spacer having the same coefficient of linear expansion as the permalloy PC material.

11. The method of claim 10, wherein:
the spacer is formed from a permalloy PC material.

12. The method of claim 9, wherein:
the step of heat-treating the worked permalloy PC materials includes a substep inclusive of an annealing substep of cooling each worked permalloy PC material gradually after the worked PC material is heated at 650° C. to 850° C.

13. The method of claim 9, wherein:
the worked permalloy PC materials each include a plurality of metallic shielding plates.

* * * * *